United States Patent
Mirkin et al.

(10) Patent No.: US 8,057,857 B2
(45) Date of Patent: Nov. 15, 2011

(54) PHASE SEPARATION IN PATTERNED STRUCTURES

(75) Inventors: Chad A. Mirkin, Wilmette, IL (US); Khalid Salaita, Evanston, IL (US)

(73) Assignee: Northwestern University, Evanston, IL (US)

( * ) Notice: Subject to any disclaimer, the term of this patent is extended or adjusted under 35 U.S.C. 154(b) by 1007 days.

(21) Appl. No.: 11/480,557

(22) Filed: Jul. 5, 2006

(65) Prior Publication Data

US 2007/0087172 A1 Apr. 19, 2007

Related U.S. Application Data

(60) Provisional application No. 60/697,053, filed on Jul. 6, 2005.

(51) Int. Cl.
*B05D 5/00* (2006.01)
(52) U.S. Cl. ............ 427/256; 427/258; 427/58; 438/52; 438/674; 438/647; 438/626; 438/962
(58) Field of Classification Search .................. 427/256, 427/58, 258; 438/53, 52, 674, 647, 626, 438/677, 962
See application file for complete search history.

(56) References Cited

U.S. PATENT DOCUMENTS

| | | | |
|---|---|---|---|
| 5,512,131 A * | 4/1996 | Kumar et al. ................ | 438/738 |
| 5,723,900 A * | 3/1998 | Kojima et al. ............... | 257/666 |
| 6,635,311 B1 | 10/2003 | Mirkin et al. | |
| 6,642,129 B2 | 11/2003 | Liu et al. | |
| 6,827,979 B2 | 12/2004 | Mirkin et al. | |
| 6,867,443 B2 | 3/2005 | Lui et al. | |
| 7,005,378 B2 | 2/2006 | Crocker et al. | |
| 7,034,854 B2 | 4/2006 | Cruchon-Dupeyrat et al. | |
| 7,060,977 B1 | 6/2006 | Dupeyrat et al. | |
| 7,491,422 B2 * | 2/2009 | Zhang et al. ................ | 427/256 |
| 2002/0122873 A1 | 9/2002 | Mirkin et al. | |
| 2003/0068446 A1 | 4/2003 | Mirkin et al. | |
| 2003/0185967 A1 | 10/2003 | Eby et al. | |
| 2004/0008330 A1 | 1/2004 | Mirkin et al. | |

(Continued)

FOREIGN PATENT DOCUMENTS

WO WO 03/048314 6/2003

(Continued)

OTHER PUBLICATIONS

D.Coffey et al. Patterning Phase Separation . . . Nanolithography, vol. 127, (2005), pp. 4564-4565.*

(Continued)

*Primary Examiner* — Lan Vinh
*Assistant Examiner* — Maki A Angadi
(74) *Attorney, Agent, or Firm* — Foley & Lardner LLP

(57) ABSTRACT

Novel phase-separation behavior by a mixture, including binary mixture, of patterning compounds, including alkanethiols, when deposited onto a surface, including a gold surface, using micro and nano-deposition tools such as tip and stamp methods like micro-contact printing (μCP), and Dip-Pen Nanolithography (DPN). This behavior is significantly different than that observed in the bulk. This behavior was demonstrated using three examples of compounds: 16-mercaptohexadecanoic acid (MHA), 1-octadecanethiol (ODT), and $CF_3(CF_2)_{11}(CH_2)_2SH$ (PFT). The identity of the resulting segregated structure was confirmed by lateral force microscopy (LFM), and by selective metal-organic coordination chemistry. This phenomenon is exploited to print sub-100 nm wide alkanethiol features via conventional μCP and to form sub-15 nm features using DPN printing, which is below the ultimate resolution of both these techniques. These nanopatterned materials also can serve as templates for constructing more complex architectures.

66 Claims, 10 Drawing Sheets

U.S. PATENT DOCUMENTS

| | | | |
|---|---|---|---|
| 2004/0026007 A1* | 2/2004 | Hubert et al. | 156/64 |
| 2004/0026681 A1 | 2/2004 | Cruchon-Dupeyrat et al. | |
| 2004/0037959 A1 | 2/2004 | Mirkin et al. | |
| 2004/0142106 A1 | 7/2004 | Mirkin et al. | |
| 2004/0175631 A1 | 9/2004 | Crocker et al. | |
| 2004/0228962 A1 | 11/2004 | Mirkin et al. | |
| 2005/0009206 A1 | 1/2005 | Mirkin et al. | |
| 2005/0235869 A1 | 10/2005 | Cruchon-Dupeyrat et al. | |
| 2005/0255237 A1 | 11/2005 | Zhang et al. | |
| 2005/0272885 A1 | 12/2005 | Mirkin et al. | |
| 2006/0014001 A1 | 1/2006 | Mirkin et al. | |
| 2006/0096078 A1 | 5/2006 | Bergaud et al. | |

FOREIGN PATENT DOCUMENTS

| | | |
|---|---|---|
| WO | WO 2005/115630 | 12/2005 |

OTHER PUBLICATIONS

P. Lenz et al. Patterned Supported . . . Poly(dimethylsiloxane)), Langmuir, vol. 20(25), (2004), pp. 11092-11099.*

W. Geyer et al. Applied Physics Letters, vol. 75, No. 16, (1999), pp. 2401-2403.*

International Search Report, PCT/US2006/026082 (Mar. 15, 2007) (2 pages).

Invanisevic, A., et al., "Site-Directed Exchange Studies with Combinatorial Libraries of Nanostructures", J. Am. Chem. Soc., vol. 124, pp. 11997-12001 (2002).

Jackson, A. M., et al., "Spontaneous assembly of subnanometre-ordered domains in the ligand shell of monolayer-protected nanoparticles", Nature Materials, vol. 3, pp. 330-336 (2004).

International Search Report, PCT/US2006/026082, filed May 7, 2006, (2 pgs.).

U.S. Appl. No. 60/697,053, filed Aug. 8, 2005, Mirkin et al.

Bain, C. D., et al., "Formation of Monolayer Films by the Spontaneous Assembly", J. Am. Chem. Soc., vol. 111, pp. 321-335 (1989).

Brewer, N. J., et al., "Chemical Force Microscopy of Mixed Self-Assembled Monolayers of Alkanethiols on Gold: Evidence for Phase Separation", Langmuir, vol. 20, pp. 4109-4115 (2004).

Chidsey, E. D., et al., "Chemical Functionality in Self-Assembled Monolayers: Strucutreal and Electrochemical Properties", Langmuir, vol. 6, pp. 682-691 (1990).

Cooper, E., et al., "Influence of Tail-Group Hydrogen Bonding on the Stabilities of Self-Assembled Monolayers of Alkylthiols on Gold", Langmuir, vol. 15, pp. 1024-1032, (1999).

Datwani, S. S., "Mixed Alkanethiol Self-Assembled Monolayers as Substrates for Microarraying Applications", Langmuir, vol. 20, pp. 4970-4976 (2004).

Deladi, S., et al., "Micromachined fountain pen for atomic force microscope-based nanopatterning", Appl. Phys. Lett., vol. 85, No. 22, pp. 5361-5363 (2004).

Kim, K., et al., "A Nanofountain Probe with Sub-100 nm Molecular Writing Resolution", Small, vol. 1, No. 6, pp. 632-635 (2005).

Evans, S. D., et al., "Self-Assembled Multilayers of ω-Mercaptoalkanoic Acids: Selective Ionic Interactions", J. Am. Chem. Soc., vol. 113, pp. 5866-5868 (1991).

Gates, B. D., et al., "Unconventional Nanofabrication", Annual Review of Materials Research, vol. 34, pp. 339-372 (2004).

Gerding, J. D., et al., "Single-Feature Inking and Stamping: A Versatile Approach to Molecular Patterning", J. Am. Chem. Soc., vol. 127, pp. 1106-1107 (2005).

Ginger, D. S., et al., "The Evolution of Dip-Pen Nanolithography", Angew Chem. Int. Ed., vol. 43, pp. 30-45 (2004).

Hatzor, A., et al., "Molecular Rules for Scaling Down Nanostructures", Science, vol. 291, pp. 1019-1020 (2001).

Hayes, W. A., et al., "Nanometer-Scale Patterning of Surfaces Using Self-Assembly Chemistry. 2. Preparation, Characterization, and Electrochemical Behavior of Two-Component Organothiol Monolayers on Gold Surfaces", Langmuir, vol. 13, pp. 2511-2518 (1997).

Herne, T. M., et al., "Characterization of DNA Probes Immobilized on Gold Surfaces", J. Am. Chem. Soc., vol. 119, pp. 8916-8920 (1997).

Hobara, D., et al., "Preferential Adsorption of Horse Heart Cytochrome c on Nanometer-Scale Domains of a Phase-Separated Binary Self-Assembled Monolayer of 3-Mercaptopropionic Acid and 1-Hexadecanethiol on Au(111)", Nano Lett., vol. 2, pp. 1021-1025 (2002).

Hong, M., et al., "Scanning nanolithography using a material-filled nanopipette", Appl. Phys. Lett. vol. 77, No. 16, pp. 2604-2606 (2000).

Hong, S., et al., "A New Tool for Studying the in Situ Growth Processes for Self-Assembled Monolayers under Ambient Conditions", Langmuir, vol. 15, pp. 7897-7900 (1999).

Hong, S., et al., "Multiple Ink Nanolithography: Toward a Multiple-Pen Nano-Plotter", Science, vol. 286, pp. 523-525 (1999).

Imabayashi, S., et al., "Selective Replacement of Adsorbed Alkanethiols in Phase-Separated Binary Self-Assembled Monlayers by Electrochemical Partial Desorption", Langmuir, vol. 13, pp. 4502-4504 (1997).

Inerowicz, H. D., et al., "Multiprotein Immunoassay Arrays Fabricated by Microcontact Printing", Langmuir, vol. 18, pp. 5263-5268 (2002).

Jang, J., et al., "Self-assembly of ink molecules in dip-pen nanolithography: A diffusion model", J. Chem. Phys. vol. 115, No. 6, pp. 2721-2729 (2001).

Jang, J., et al., "How Narrow Can a Meniscus Be?", Phys. Rev. Letts., vol. 92, No. 8, pp. 085504-1-085504-4 (2004).

Kumar, A., et al., "Patterned Condensation Figures as Optical Diffraction Gratings", Science, vol. 263, pp. 60-62 (1994).

Lee, K., et al., "The Use of Nanoarrays for Highly Sensitive and Selective Detection of Human Immunodeficiency Virus Type 1 in Plasma", Nano Lett., vol. 4, No. 10, pp. 1869-1872 (2004).

Lewis, A., et al., "Fountain pen nanochemistry: Atomic force control of chrome etching", Appl. Phys. Lett., vol. 75, No. 17, pp. 2689-2691 (1999).

Lewis, P. A., et al., "The Role of Buried Hydrogen Bonds in Self-Assembled Mixed Composition Thiols on Au{111}", J. Phys. Chem.. B, vol. 105, pp. 10630-10636 (2001).

Meister, A., et al., "Nanoscale dispensing of liquids through cantilevered probes", Microelectron Eng., vol. 67-68, pp. 655-650 (2003).

Meylan, W. M., et al., "Improved Method for Estimating Water Solubility From Octanol/water Partition Coefficient", Environ. Toxicol. Chem., vol. 15, No. 2, p. 100-106 (1996).

Odom, T. W., et al., "Improved Pattern Transfer in Soft Lithography Using Composite Stamps", Langmuir, vol. 18, pp. 5314-5320 (2002).

Overney, R. M., et al., "Force Microscopy Study of Friction and Elastic Compliance of Phase-Separated Organic Thin Films", Langmuir, vol. 10, pp. 1281-1286 (1994).

Piner, R. D., et al., "Dip-Pen Nanolithography" Science, vol. 283, pp. 661-663 (1999).

Rosi, N. L., et al., "Nanostructures in Biodiagnostics," Chem. Rev., vol. 105, pp. 1547-1562 (2005).

Rozhok, S., et al., "Dip-Pen Nanolithography: What Controls Ink Transport?", J. Phys. Chem. B, vol. 107, pp. 751-757 (2003).

Rozhok, S., et al., "AFM Study of Water Meniscus Formation between an AFM Tip and NaCl Substrate", J. Phys. Chem. B, vol. 108, pp. 7814-7819 (2004).

Salaita, K., et al., "Spontaneous 'Phase Separation' of Patterned Binary", Langmuir, vol. 17, pp. 11283-11287 (2005).

Satjapipat, M., et al., "Selective Desorption of Alkanethiols in Mixed Self-Assembled Monoayers for Subsequent Oligonucleotide Attachment and Dna Hybridization", Langmuir, vol. 17, pp. 7637-7644 (2001).

Sheehan, P. E., et al., "Thiol Diffusion and the Role of Humidity in 'Dip Pen Nanolithography'", Phys. Rev. Letts., vol. 88, No. 15, pp. 156104-1-156104-4 (2002).

Stranick, S. J., et al., "Phase Separation of Mixed-Composition Self-Assembled Monolayers into Nanometer Scale Molecular Domains", J. Phys. Chem., vol. 98, pp. 7636-7646 (1994).

Stranick, S. J., et al., "Nanometer-scale phase separation in mixed composition self-assembled monolayers", Nanotechnology, vol. 7, pp. 438-442 (1996).

Taha, H., et al., "Protein printing with an atomic force sensing nanofountainpen", Appl. Phys. Lett., vol. 83, No. 5, pp. 1041-1043 (2003).

Tamada, K., et al., "Surface Phase Behavior of n-Alkanethiol Self-Assembled Monolayers Adsorbed on Au(111): An Atomic Force Microscope Study", Langmuir, vol. 13, pp. 158-1566 (1997).

Tien, J., et al., "Fabrication of aligned microstructures with a signle elastomeric stamp", PNAS, vol. 99, No. 4, pp. 1758-1762 (2002).

Weinberger, D A., et al., "Combinatorial Generation and Analysis of Nanometer- and Micrometer-Scale Silicon Features via 'Dip-Pen' Nanolithography and Wet Chemical Etching", Adv. Maters., vol. 12, No. 21, pp. 1600-1603 (2000).

Xia, Y., et al., "Soft Lithography," Angew. Chem. Int. Ed., vol. 37, pp. 550-575 (1998).

Xu, S., et al., "Nanometer Scale Fabrication by Simultaneous Nanoshaving and Molecular Self-Assembly," Langmuir, vol. 13, pp. 127-129 (1997).

Zhang, Y., et al., "A Massively Parallel Electrochemical Approach to the Miniaturization of Organic Micro- and Nanostructures on Surfaces", Langmuir, vol. 20, pp. 962-968 (2004).

Zheng, T., et al., "A General and Mild Synthesis of Thioesters and Thiols from Halides", Tetrahedron Letts., vol. 40, pp. 603-606 (1999).

* cited by examiner

PHASE SEPARATION IN PATTERNED STRUCTURES

RELATED APPLICATION

This application claims priority to provisional patent application to Mirkin et al, Ser. No. 60/697,053, filed Jul. 6, 2005, which is hereby incorporated by reference in its entirety.

STATEMENT ON FEDERAL FUNDING

This work was supported at least in part from grants from the Air Force Office of Scientific Research (AFOSR), Grant No. F49620-00-1-0283, and the Defense Advanced Research Projects Agency (DARPA), Grant No. DAAD 19-03-1-0065, and the National Science Foundation (NSF), Grant No. EEC-0118025, and the federal government have certain rights in the inventions.

BACKGROUND

A commercial need exists to improve lithography and patterning technology at the micron and nano-scale, including the sub-100 nm scale. Applications include biological applications such as microarrays and nanoarrays for proteins and nucleic acids. Other applications include semiconductor and molecular electronics. In particular, self-assembled monolayers (SAMs) can be a useful strategy for lithography and patterning. An understanding of the factors that control SAM formation and behavior both on the macro- and nanoscopic length scales is important for the technology to reap its full potential. With the advent of molecular deposition tools such as Dip Pen Nanolithography (DPN) printing, it is now possible to study such processes on the nanometer to micrometer length scale (see, for example, Piner et al., *Science* 1999, 283, 661-663; Ginger et al., *Angew Chem Int Edit* 2004, 43, 30-45; Hong et al. *Science* 1999, 286, 523-525; Hong et al., *Langmuir* 1999, 15, 7897-7900; see also U.S. Pat. Nos. 6,635,311 and 6,827,979) A fundamental issue with such deposition processes pertains to the transport properties of a binary mixture of ink molecules, see for example FIG. 1. For example, the transport of such mixtures could potentially at least result in a nano- or micro structure with a homogenous distribution of adsorbate molecules (FIG. 1, far right), a structure with island-like phase separation (FIG. 1, middle), or a near-complete phase separation of the two adsorbates (FIG. 1, far left).

The commercialization of nanometer-scale mixing of binary monolayers is important for at least two reasons. First, it allows one to elucidate the fundamental properties and origins of phase segregation for two-component mixtures on surfaces. Second, it allows one to deliberately tailor desired surface properties at the sub-50 nm length scale. Applications would include for example DPN printing and microcontact printing (μCP). See, for example, Kumar et al., *Science* 1994, 263, 60-62; Odom et al., *Langmuir* 2002, 18, 5314-5320; Gates et al., *Annual Review of Materials Research* 2004, 34, 339-372.

Surprisingly few examples of nanometer scale phase separation have been reported for binary SAM mixtures (see, for example, Stranick et al., *Journal of Physical Chemistry* 1994, 98, 7636-7646; Imabayashi et al. *Langmuir* 1997, 13, 4502-4504; Tamada et al., *Langmuir* 1997, 13, 1558-1566; Hayes et al. *Langmuir* 1997, 13, 2511-2518; Jackson et al., *Nature Materials* 2004, 3, 330-336).

Spontaneous but random phase separation has been observed in scanning tunneling microscope (STM) images of co-adsorbed alkanethiol mixtures on atomically flat gold surfaces (see for example Stranick et al., *Journal of Physical Chemistry* 1994, 98, 7636-7646; Imabayashi, et al., *Langmuir* 1997, 13, 4502-4504; Jackson et al., *Nature Materials* 2004, 3, 330-336; Stranick et al., *Nanotechnology* 1996, 7, 438-442; Lewis *J Phys Chem B* 2001, 105, 10630-10636).

It is believed that phase separation of mixed SAMs can be a process which can be driven by polar head group interactions and cohesive interactions between the adsorbate molecules. In such systems, the adsorbates randomly form nanoscale domains with no particular order (see for example Lewis et al., *J Phys Chem B* 2001, 105, 10630-10636). Phase-separated binary SAMs have been shown useful in resisting non-specific protein adsorption (see for example Jackson et al. *Nature Materials* 2004, 3, 330-336.), improving DNA hybridization (see for example Satjapipat et al. *Langmuir* 2001, 17, 7637-7644.), improving the data quality in microarrays (see for example Datwani *Langmuir* 2004, 20, 4970-4976) and preferential adsorption of cytochrome C (see for example Hobara *Nano Lett* 2002, 2, 1021-1025.).

SUMMARY

By methods described herein, high resolution patterning can be achieved which increases the resolution of present patterning methods to substantially finer levels. Surprisingly controlled, organized phase separated structures can be formed, amenable to commercial application. For example, a stamp or tip can be used with has a feature size of dimension X, but features produced by the stamp or tip, respectively, are substantially less than X.

One embodiment provides a method comprising: (A) disposing an ink mixture comprising at least two different patterning compounds, including a first patterning compound and a second patterning compound, (i) on a tip disposed on a cantilever or (ii) on a stamp, (B) contacting the tip or the stamp with a surface, wherein transport of the first and second patterning compounds occurs from the tip or the stamp to the surface to produce on the surface a phase separated structure comprising the first and second patterning compounds.

In one preferred embodiment, the tip is used. This embodiment provides a method comprising: (i) disposing an ink mixture comprising at least two different patterning compounds, including a first patterning compound and a second patterning compound, on a tip disposed on a cantilever, (ii) contacting the tip with a surface, wherein transport of the first and second patterning compounds occurs from the tip to the surface to produce on the surface a phase separated structure comprising the first and second patterning compounds.

In another preferred embodiment, the stamp is used. This embodiment provides a method comprising: (i) disposing an ink mixture comprising at least two different patterning compounds, including a first patterning compound and a second patterning compound, on a on a stamp, (ii) contacting the stamp with a surface, wherein transport of the first and second patterning compounds occurs from the stamp to the surface to produce on the surface a phase separated structure comprising the first and second patterning compounds.

Still further, also provided is a method comprising: (i) disposing an ink mixture comprising at least two different patterning compounds, a first patterning compound and a second patterning compound, on a surface having a patterned relief structure, (ii) contacting the relief structure with a surface, (iii) wherein transport of the first and second patterning compounds occurs from the relief structure to the surface to produce on the surface a phase separated structure comprising the first and second patterning compounds.

In another embodiment, provided is a method comprising: delivering a binary mixture of a first patterning compound and a second patterning compound from a tip or a patterned stamp to a surface, wherein the first patterning compound comprises a hydrophobic tail, and the second patterning compound comprises a hydrophilic tail.

Still further provided is an article comprising: a solid surface, a phase separated structure on the substrate comprising a first patterning compound and a second patterning compound, wherein the first and second patterning compounds are chemisorbed to the solid surface, and the first or second patterning compound have a lateral dimension which is about 15 nm or less.

Also provided is an ordered array comprising a series of ordered dots or lines, wherein the dots comprise a hydrophilic dot interior and a hydrophobic dot exterior.

In exemplified embodiments, results are described for patterning binary alkanethiol mixtures with hydrophobic and hydrophilic terminal-functionalized tail groups. Interestingly, an unusual near-complete phase separation process is described that results in nanostructures consisting of hydrophilic interiors and hydrophobic peripheries. This phenomenon extends beyond DPN printing to the lower resolution and high-throughput micro-contact printing (μCP) process, and can be used to increase the resolution of both techniques.

In exemplified embodiments, binary ink mixtures of alkanethiols exhibit near-complete phase separation behavior when deposited using micro or nano-deposition tools such as DPN printing and μCP, a consequence of factors such as the choice of ink pairs and the different transport properties of the chosen adsorbate molecules. The more hydrophilic alkanethiol forms the interior phase, while hydrophobic alkanethiols forms the outer phase, when these mixtures are patterned using DPN printing or μCP. This is in contrast to the bulk behavior of such adsorbates, in the context of SAMs formed from solution on gold substrates. By tailoring ink mixture composition, this phase-separation behavior can be exploited to print sub-100 nm lines in the case of μCP, and sub-15 nm lines in the case of DPN printing.

DETAILED DESCRIPTION

Introduction

Figure 1:
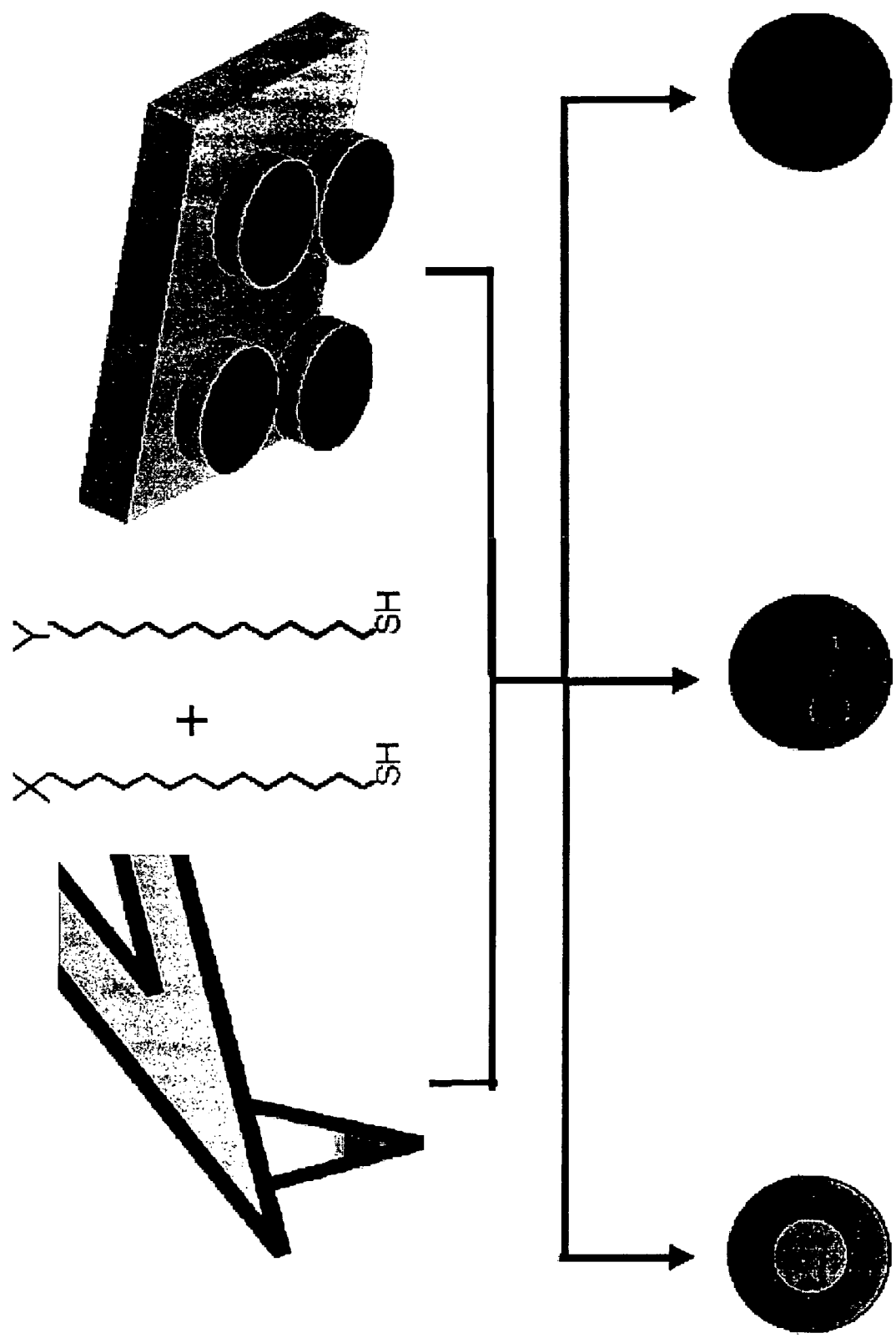
FIG. 1. Possible outcomes of patterning a binary mixture of two alkanethiols using μCP and DPN printing.

All references cited herein are hereby incorporated by reference in its entirety.

Priority provisional patent application to Mirkin et al, Ser. No. 60/697,053, filed Jul. 6, 2005, is hereby incorporated by reference in its entirety. In addition, Salaita et al., J. Am. Chem. Soc., 127(32), 11283-11287, 2005 is hereby incorporated by reference in its entirety.

Examples of DPN printing are describe in for example U.S. Pat. Nos. 6,635,311; 6,827,979; and 7,005,378, as well as patent publication 2002/0122873, which are hereby incorporated by reference including inks, substrates, patterning modes, working examples, claims, and figures. Instruments, pens, substrates, inks, software, accessories, expertise, and technology can be obtained from NanoInk, Inc. (Chicago, Ill.).

The various embodiments described herein can be used in parallel or serial patterning modes, as well as direct write nanolithography mode.

One embodiment provides a method comprising: (A) disposing an ink mixture comprising at least two different patterning compounds, including a first patterning compound and a second patterning compound, (i) on a tip disposed on a cantilever or (ii) on a stamp, (B) contacting the tip or the stamp with a surface, wherein transport of the first and second patterning compounds occurs from the tip or the stamp to the surface to produce on the surface a phase separated structure comprising the first and second patterning compounds.

Surface

The surface is not particularly limited. It can be adapted for use with the first and second patterning compound to form stable structures. The surface can be part of a substrate. The substrate can be a single layer of material or can comprise multiple layers. Oxidation surface layers can be used. The surface can comprise a solid surface including for example an inorganic surface or an organic surface. The surface can be planar or non-planar. The surface can comprise a metal or metal oxide surface. The surface can comprise a semiconductor material, a ceramic material, a glass surface. In general, relatively flat or smooth surfaces are preferred. Relatively inert surfaces can be used. Examples of surfaces include gold, silver, copper, Pd, Pt, GaAs, InP, SiO2, glass, Si, Si—H, Si—Cl, metal oxides, ZrO2, and Indium Tin Oxide (ITO). Gold surfaces including polycrystalline gold surfaces can be used. U.S. Pat. Nos. 6,635,311 and 6,827,979 describe an extensive variety of surfaces which can be used, which are hereby incorporated by reference in their entirety.

The surface can be adapted for additional testing of the phase separated structure which is disposed on the surface. See for example, U.S. Patent Publication 2004/0026681 to Cruchon-Dupeyrat et al, which is hereby incorporated by reference in its entirety. For example, electrodes can be placed on the surface for electrical measurements of the deposited structures.

Ink

The ink or ink mixture can be disposed on the tip or stamp by a variety of ways which are not particularly limited. Known methods for DPN printing or microcontact printing can be used. Ink delivery systems can be used including both passive and active methods for ink transport. Inks can be liquid compositions which are adapted for flow and fluid transport, be it active or passive. The ink mixture can comprise at a minimum a first patterning compound and different second patterning compound, or a first patterning material and a second patterning material. In a typical ink mixture, the mixture comprises (i) solvent or dispersion system, often comprising volatile or washable liquids which are not designed for permanent attachment to the surface; (ii) patterning compounds or materials which are designed for attachment to the surface; (iii) optional additives which in many cases will be removed from the surface along with the solvent system.

For example, the ink can be disposed on the tip by immersing the tip in the ink mixture and removing it. The ink mixture can be dried on the tip before depositing the ink on the surface. The ink can also be transported, moved, or otherwise delivered to the tip end for deposition onto the surface. Ink can be disposed on the stamp by known methods in microcontact printing.

Ink formulations can be developed with are reactive ink formulations or non-reactive ink formulations. In a non-reactive ink formulation, the ink is essentially stable and does not react. It may react upon contact with the surface via a covalent binding, electrostatic binding, or an adsorption including chemisorption. In reactive ink formulation, the ink is reactive by itself before deposition onto the surface. For example, U.S. Patent Publications 2003/0185967 and 2004/0142106 to Mirkin et al., describe reactive ink formulations including sol-gel inks.

Ink Delivery methods are described in for example U.S. Pat. No. 7,034,854 to Cruchon-Dupeyrat et al., which is hereby incorporated by reference in its entirety.

The concentration of the patterning compounds in the ink mixture is not particularly limited but can be for example about 0.001 mM to about 10 M, or about 0.01 M to about 1 M, or about 0.5 M to about 0.5 M.

The amount of the first patterning compound with respect to the second patterning compound is not particularly limited. These amounts can be expressed with respect to the total molar amount of patterning compound in the ink mixture. For example, about 10% to about 90%, or about 25% to about 75%, of the total molar amount of patterning compound in the ink mixture including both first and second patterning compounds, can be the first patterning compound. For a binary mixture, the molar amount of first and/or second patterning compounds can be about 10% to about 90%, or about 25% to about 75%, of the total molar amount of patterning compound.

In one embodiment, the ink mixture comprises only two patterning compounds, not three or more. The solvent system can be adapted as needed with additives, such as for example surfactants, to improve transport. In one embodiment, a basic and novel feature of the embodiment is that the ink mixture consists essentially of two patterning compounds and a solvent system. In some cases, a third, fourth, fifth, and higher patterning compound could be used.

Patterning Compounds and Materials

Patterning compounds and materials are described in U.S. Pat. Nos. 6,635,311 and 6,827,979, which are hereby incorporated by reference in their entirety. See also Xia and Whitesides, "Soft Lithography," Angew. Chem. Int. Ed., 1998, 37, 550-575, and references cited therein, for listing of substrates and ligands which can form self assembled monolayers (e.g., Table 4, page 554), which is hereby incorporated by reference in its entirety. Materials different than low molecular weight molecular compounds can be used as patterning compound. The ink mixture can comprise a first patterning compound and a second patterning compound, as well as a solvent for dispersing or dissolving the patterning compounds. The first and second patterning compounds are different compounds. The first and second patterning compounds can be also used free of solvent. The patterning compounds can be adapted or otherwise selected for preparation of stable structures after transport to the surface. Stability can be determined by for example letting the structures sit over time such as 48 or 96 hours (liquids can evaporate), or washing the structures with solvents to remove those structures which do not adhere well to the surface. The patterning compounds can be adapted for covalent bonding or chemisorption to the surface. The patterning compounds can be adapted or otherwise selected to have the ability to form self-assembled monolayers. Self assembled monolayers are generally known in the art including the various references cited in herein which describe sulfur-on-gold bonding. See also for example Xu and Liu, "Nanometer Scale Fabrication by Simultaneous Nanoshaving and Molecular Self Assembly," Langmuir, 1997, 13, 127-129, which is hereby incorporated by reference in its entirety.

The patterning compounds can be molecular compounds having a molecular weight of about 1,000, or about 500, grams per mole or less. In other embodiments, the patterning compound can be a larger macromolecule having molecular weight of for example 1,000 to 10,000, or 1,000 to 1,000,000. Mixtures of compounds, such as polymer mixtures, can be used which have a statistical average molecular weight.

In addition, electrostatic attraction can be used for patterning. See for example U.S. Patent Publication No. 2004/0008330 to Mirkin et al.

The patterning compounds can be represented as X—Y-T, wherein X represents a functional group which is adapted for surface interaction and binding to the surface. Y can be a spacer moiety, separating X and T. Examples of Y include alkylene —$(CH_2)$— spacers or spacers comprising fluorine atoms. T can be a terminal moiety which upon transport to the surface, and binding of X to the surface, forms a new surface which can be for example hydrophilic or hydrophobic. Examples include alkanes, alkenes, fluorocarbons, acids, esters, amines, amides, alcohols, nitrites, and ethers.

The first patterning compound can be adapted to provide a hydrophobic surface. For example, tail groups which extend to the surface top can be adapted to be hydrophobic. For example, the contact angle of water can be greater than 90 degrees, or even greater than 100 degrees, or even greater than 105 degrees or 110 degrees. Terminal groups providing hydrophobic surfaces including alkyl, including methyl, and fluorinated groups, including—$CF_3$. Spacer groups can be used with fluorine atoms such as —$(CF_2)$— or —$(CHF)$—. The first patterning compound can be adapted or otherwise selected to not allow for hydrogen bonding. For example, if it is an X—Y-T molecule, then Y and T can be free of atoms which can participate in hydrogen bonding such as oxygen and nitrogen.

The second patterning compound can be adapted to provide a hydrophilic surface. For example, the contact angle of water can be less than 90 degrees, or less than 80 degrees, or less than 70 degrees, or less than 60 degrees, or less than 50 degrees. Terminal groups providing hydrophilic surfaces include for example polar groups comprising oxygen and nitrogen, including carboxyl —COO— functionality and amino functionality, including for example acidic groups or groups capable of hydrogen bonding through nitrogen or oxygen atoms. Examples include carboxylic acid and derivatives thereof. The group can be selected for use in further reactions such as reactions with proteins and metals, metal complexes, or metal ions.

Preferred examples are sulfur-containing compounds including mercaptos or thiols, alkanethiolates, such as HS—Y-T compounds and those containing —S—S— linkages, as well as disulfides including dialkyl disulfides.

Silanes can be used including those which can be described as X—Y-T molecules with X being a reactive silane, Y being the spacer, and T being the reactive or unreactive moiety.

Functionally, the patterning compounds are selected to provide phase separation, and one skilled in the art can select and experiment accordingly from the teachings herein. Phase separation can begin or occur when the ink is on the tip or stamp, or begin or occur as part of the transport step, or both. Enthalpic and entropic considerations can be used, as well as thermodynamic and kinetic effects. Crystallization, packing, and ordering in two or three dimensions may be desired in some cases and an important factor to phase separation.

Biological entities such as peptides, proteins, nucleic acids, DNA, RNA, and the like can be used and modified as needed to be used as a patterning compound. See for example, Herne et al, "Characterization of DNA Probes Immobilized on Gold Surfaces," J. Am. Chem. Soc., 1997, 119, 8916-8920, which is hereby incorporated by reference in its entirety.

Contacting Step

The contacting step can be carried out in several different ways and is not particularly limited. Known methods in DPN printing and microcontact printing can be used. For example, in scanning probe and AFM-related technology, different modes are used to have tips interact with surfaces which include for example contact mode, non-contact mode, and intermittent contact mode or tapping mode. Cantilevers can be oscillated. Known feedback methods can be used for positioning and alignment in the X, Y, and Z directions.

The contacting step can be carried out with the tip moving only in the Z direction, up and down, with respect to the XY plane of the surface. The contacting step here can be carried out without translation of the tip over the surface, moving in the XY plane. Alternatively, the tip can be translated over the surface, moving in the XY plane.

The transport can be adapted so that the phase separated structure has a diameter which grows linearly as a function of square root of hold time.

Contacting can be carried out under conditions such as humidity, temperature, and gaseous atmosphere which provide for a water meniscus between the tip and surface. For example, humidity can be at least about 25%, or at least about 40%, or at least about 50%. Conditions can be controlled with use of environmental chambers. The gaseous atmosphere can be air, an inert atmosphere, an atmosphere with controlled humidity, or with the presence of other volatile or gaseous compounds such as vapors of organic compounds or volatile solvents such as alcohols like methanol or ethanol. Conditions can be selected to not favor a water meniscus including for example anhydrous conditions or conditions wherein all reagents and surfaces are selected to be free of water.

The contacting can be done manually or by instrument with computer control. Software can be used which can facilitate pattern design, calibration, leveling, and alignment. Calibration methods are described in for example U.S. Pat. No. 7,060,977 to Cruchon-Dupeyrat et al., which is hereby incorporated by reference. Alignments methods are describe in for example 2003/0185967 to Eby et al., which is hereby incorporated by reference.

Contacting can be done more than once, repetitively, in either the same spot or at different locations.

Phase Separated Structure

After transport is complete, a phase separated structure can be formed. This structure can be for example a line or a dot. The line can be a straight line or a curvilinear line. The line can form for example, rings, squares, pentagons, and any geometric shape, whether symmetric or unsymmetric, regular or irregular. Pluralities of phase separated structures can be formed by multiply executing the process with a single step and multiple delivery points, or multiple steps with a single delivery point, or multiple delivery points done with multiple steps. The structures can be a self assembled monolayer or a submonolayer or a multilayer.

Layers can be built by repeating the process including the contact step. For example, one layer can comprise a plurality of patterning compounds, wherein an adjacent layer can comprise a single patterning compound. Or multiple layers can be built wherein each layer comprises a least two patterning compounds. Known alignment methods can be used including alignment marks and appropriate alignment software.

The structure can be organic, inorganic, or a combination.

The phase separated structure comprises the first patterning compound and the second patterning compound. The phase separated structure can be substantially filled by the patterning compounds although some defects may be present resulting in opening. However, over 70%, or over 80%, or over 90% of the phase separated structure can be filled with patterning compound. The first patterning compound can surround the second patterning compound. For example, the phase separated structure can be in the form of a dot or a circle comprising the first patterning compound concentrated in the interior in a distinct region. The phase separated structure can be in the form of a dot comprising an interior circle surrounded by a ring to form the dot. In addition, the phase separated structure can be in the form of a dot comprising an interior circle and a plurality of surrounding concentric rings.

The interface between phases in the first and second patterning compounds can be a distinct interface, although the precise level of distinctness can depend on the method of measuring the interface.

The phase separated structure can be substantially flat. For example, if the first and second patterning compounds have approximately the same length, and are orderly arranged on the surface extending upward from the surface at a similar angle, then a smooth surface can result. For example, scanning probe data may show height differences of about 3 nm, or about 2 nm, or about 1 nm, or less.

Note that the use of the term phase separation in the context of monolayer structures is not meant to imply or require the realization of an equilibrated system but rather a concentration of each of the two adsorbates in assignable areas on the substrate. A particular phase in a phase separated structure can be enriched in the first patterning compound for example, but not be totally free of the second patterning compound. For example, it may be at least 70%, or at least 80%, or at least 90% pure. And also, a particular phase in a phase separated structure can be enriched in the second patterning compound for example, but not be totally free of the first patterning compound. For example, it may be at least 70%, or at least 80%, or at least 90% pure.

The phase separated structure can be analyzed in terms of the surface structure comprising the first patterning compound, and the surface structure comprising the second patterning compound. For example, about 10% to about 90%, or about 25% to about 75%, of the area can comprise the first patterning compound phase, or the second patterning compound phase. The percentage can be substantially the same as the percentage used in the ink mixture. Or the percentage can be different if for example selective enrichment occurs wherein one patterning compound is transported faster or otherwise differently, or packs differently on the surface, than another one which results in a differential.

The dimensions of the phase separated structure are not particularly limited. For example, the height can be about 50 nm, about 40, about 30, about 20, about 10, or about 5 nm or less. Height is taken in the Z direction, orthogonal to the surface XY plane. Monomolecular structures can be formed, including those having good crystalline like packing which show x-ray patterns.

In the XY plane, lateral dimensions can be measured including for example dot diameter or line width. The phase separated structure can be characterized by for example a lateral dimension which is about two microns or less, or about one micron or less, or about 500 nm or less, or about 100 nm or less. For example, the phase separated structure can be a dot characterized by a dot diameter which is about 10 nm to about 2 microns, or about 100 nm to about 1 micron. Or the phase separated structure can be a line having a line width of about two microns or less, or about one micron or less, or about 10 nm to about two microns, or about 25 nm to about one micron.

In the XY plane, lateral dimensions for the phase separated structure can be also characterized by the structure of the first or second patterning compounds, excluding the part of the structure formed by the other patterning compound. For example, a lateral dimension can be formed which is about 100 nm or less, or about 50 nm or less, or about 15 nm or less.

Characterizing the Phase Separated Structures

The phase separated structure can be examined for structure and order, composition, wettability, thickness, coverage, degree of perfection, and defects. Methods for characterizing the surface include for example scanning probe microscopy, STM, AFM, LFM, IR, low energy helium diffraction, x-ray diffraction, transmission electron diffraction, surface Raman scattering, sum frequency spectroscopy, XPS, temperature programmed desorption (TPD), mass spectrometry, contact angle, ellipsometry, quartz crystal microbalance, surface acoustic wave, electrochemistry, and wet etching.

Further Modificaction of Surface and Phase Separated Structure

The surface surrounding the phase separated structure can be modified as desired. For example, it can be passivated against further interactions. For example, undesired or non-specific protein binding can be prevented by surface passivation.

In addition, the phase separated structure itself can be modified as desired. For example, it can be chemically treated and reacted which may or may not change the height. Additional structures can be built on the phase separated structure. These can be nanostructures or larger structures. For example, biological entities such as proteins, capture compounds, or cells can be bound, particles such as polymer particles can be bound, nucleic acid hybridization can be carried out, metals and metal ions, and the like. The modification may modify selectively only the first patterning compound, or selectively only the second patterning compound, or nonselectively to modify both.

Adsorbed molecules can be exchanged for other adsorbed molecules.

Modification can be carried out by exposing the phase separated structures to liquid or gas or vacuum based treatments. Electrochemical treatment, including electrochemical whittling, desorption, and removal of structures, can be carried out. Additional compounds are reacted with the surface to generate new stable structures. Chemical reactions can be induced including coordination bonding, complexation, hydrogen bonding, chemisorption, covalent bonding, and electrostatic bonding. Compounds can be added or subtracted.

Tips and Stamps

The tip embodiment will be further described. The stamp embodiment will also be further described. Many of the parameters described herein such as the selection of the patterning compound, surface, and contact conditions can be used for both tip and stamp embodiments. Tips and stamps are used in other technologies besides DPN printing and microcontact printing.

Tips known in art of DPN printing can be used. Sharp tips can be used which are characterized by a sharp, pointed end. The tip can be for example a nanoscopic tip. The tip can be for example a scanning probe microscope tip or an atomic force microscope tip. Tips can be engineered to be useful for scanning probe or AFM measurements if suitably adapted with cantilever and feedback mechanism. The tip can be a hollow tip or a solid tip. The tip can comprise a channel for delivery of the ink mixture. Tips including solid and hollow tips are further described in for example U.S. Pat. Nos. 6,635,311 and 6,827,979, as well as 2002/0122873, which are hereby incorporated by reference in their entirety. WO 2005/115630 to Henderson et al, published Dec. 8, 2005, also describes an elongated bean with elongated aperture for deposition on surfaces. See also U.S. Patent Publication 2006/0096078 to Bergaud et al. for deposition based on slit or groove technology; see also, Espinosa et al., Small, 1, No. 6, 632-635, 2005 for nanofountain probe writing; Lewis et al., Appl. Phys.

Lett., 1999, 75, 2689-2691; Taha et al., Appl. Phys. Lett., 2003, 83, 1041-1043; Hong et al, Appl. Phys. Lett., 2000, 77, 2604-2606; Meister et al., *Microelectron. Eng.*, 2003, 67-68, 644-650; Deladi et al., Appl. Phys. Lett., 85, 5361-5363.

Tips can comprise hard inorganic, ceramic materials, or softer organic materials. Semiconductor materials can be used. Insulative and conductive materials can be used. Tips known in the art of AFM imaging, for example, can be used including silicon or silicon nitride. For example, polymer or polymer-coated tips can be used. See for example U.S. Patent Publication No. 2005/0255237 to Zhang et al, which is hereby incorporated by reference in its entirety. Polymer tips and cantilevers are describe in for example Mirkin and Liu, U.S. Patent Publication No. 2004/0228962, describing scanning probe contact printing.

The tip disposed on the cantilever can be part of a larger structure comprising a plurality of tips disposed on a plurality of cantilevers. These can be called multipen structures or parallel pen structures. For example, the multipen structure can have over 20, or over 100, or over 1,000, or over 10,000, or over 100,000, or over 1,000,000 individual tips. The cantilevers and tips can be adapted for individual actuation, wherein one tip can be raised or lowered independently of another tip. Individual actuation is described in for example U.S. Pat. Nos. 6,867,443 and 6,642,129 to Liu et al, which are hereby incorporated by reference in their entirety. Electrostatic or thermal actuation can be used.

Tips can be thermally heated and activated for temperature control.

Stamps known for microcontact printing can be used. See for example Xia and Whitesides, "Soft Lithography," Angew. Chem. Int. Ed., 1998, 37, 550-575, and references cited therein, for description of microcontact printing including stamps (pages 558-563). In general, stamps are fabricated for massive parallel printing using Z direction motion rather than serial motions with fine XY motion. Stamps can comprise a single material or can be formed by multilayering methods including surface treatments to improve printing. One surface layer can supported which has different properties than the support, e.g., stiffer. The stamp can comprise a polymer including an elastomer or a crosslinked rubber such as for example a hydrophobic polymer such as a silicone polymer or siloxane polymer which is adapted for accepting ink but also depositing ink. The stamp can be patterned to form lines, including straight and curvilinear lines, or circles or dots.

The stamp can be fabricated to have very small structures which can be a tip.

In addition, surfaces can be used which provide relief structures. Here, some areas of the surface rise above other areas of the surface, and the ink primarily coats the raised up areas.

Other Lithographies Besides DPN and Microcontact Printing

Soft lithographic methods including microcontact printing can be used. See for example Xia and Whitesides, "Soft Lithography," Angew. Chem. Int. Ed., 1998, 37, 550-575, which is hereby incorporated by reference in its entirety. Methods using a patterned elastomeric material as mask, stamp, or mold. Besides microcontact printing, other methods include replica molding (REM), microtransfer molding (µTM), micromolding in capillaries (MIMIC), and solvent-assisted micromolding (SANIM).

Articles of Phase Separated Structures

Also provided is an article comprising: a solid surface, a phase separated structure on the substrate comprising a first patterning compound and a second patterning compound, wherein the first and second patterning compounds are chemisorbed to the solid surface, and the first or second patterning compound have a lateral dimension which is about 15 nm or less. The structure can comprise a dot or line. The first patterning compound can provide a hydrophobic surface and the second patterning compound can provide a hydrophilic surface. The structure can comprise a self assembled monolayer.

Ordered arrays in two dimensions can be prepared which are characterized by a series of patterned structures and an average distance between the individual pattern structures in a line, the distances measured either from the center point of the structures or from the edges of the structures. The average distance for patterns in a line, whether center to center or edge to edge, can be about one micron or less, or about 500 nm or less, or about 250 nm or less, or about 100 nm or less, or about 50 nm or less. For example, ordered arrays can be rectangular or hexagonal. The individual patterns can be dots having dot diameters or lines having line widths as described above. The average distance for patterns in which are not in a line, whether center to center or edge to edge, can be about five microns or less, or about one micron or less, or about 500 nm or less, or about 250 nm or less, or about 100 nm or less, or about 50 nm or less.

Applications

Biological, diagnostic, assays, sensors, semiconductor, electronic, and magnetic applications can be benefited with use of the various embodiments described herein.

Many applications of DPN printing are described in Ginger, Zhang, and Mirkin, "The Evolution of Dip Pen Nanolithography," Angew. Chem. Int. Ed., 2004, 43, 30-45, which is hereby incorporated by reference in its entirety.

Applications for microcontact printing are described in for example Xia and Whitesides, "Soft Lithography," Angew. Chem. Int. Ed., 1998, 37, 550-575, and references cited therein, which is hereby incorporated by reference in its entirety.

Biological applications include assays, diagnostics, sensor, protein microarrays, nucleic acid and DNA microarrays, nanoarrays, cell adhesion and growth, and the like. Biodiagnostic applications are described in for example Rose & Mirkin, "Nanostructures in Biodiagnostics," Chem. Rev., 2005, 105, 1547-1562, which is hereby incorporated by reference in its entirety. DNA microarrays are described in DNA Microarrays, A Practical Approach, Ed. Schena, 1999, Oxford University Press.

Applications for protein and peptide nanoarrays are described in for example U.S. Patent Publication No. 2003/0068446 to Mirkin et al., which is hereby incorporated by reference in its entirety. For example, surfaces can be patterned with compounds adapted for capturing a variety of proteins and peptide structures.

Further assays can be developed including for example testing for diseases such as HIV. See for example Lee et al, "Nano-Immunoassays for Ultrahigh Sensitive/Selective Detection of HIV," NanoLett. 2004, 4, 1869-1872, which is hereby incorporated by reference in its entirety. This describes patterning of MHA, which is then deprotonated so features are negatively charged. Monoclonal antibodies to the HIV-1 p24 antigen are then immobilized on the MHA and then exposed to plasma samples taken from infected patients. Nanoparticle probes can be used to detect and amplify the signal.

In these and other biological applications, surfaces can be passivated to prevent non-specific binding including non-specific protein binding. See also U.S. Patent Publication No. 2005/0009206 to Mirkin et al, which is hereby incorporated by reference in its entirety.

Nucleic acid related methods including nucleic acid inks are described in for example PCT publication WO 2003/048314 published Jun. 12, 2003 to Mirkin et al, "DIRECT WRITE NANOLITHOGRAPHIC DEPOSITION OF NUCLEIC ACIDS FROM NANOSCOPIC TIPS," which is hereby incorporated by reference in its entirety.

Photomask repair applications are described in for example U.S. Patent Publication 2004/0175631 to Crocker et al., which is hereby incorporated by reference in its entirety.

Polymerization reactions can be used conducted on top of the patterned nanostructures through use of polymer monomers and catalysts, see for example U.S. Patent Publication No. 2005/0272885 to Mirkin et al., which is hereby incorporated by reference in its entirety.

Flat Panel Display applications are described in for example U.S. Patent Publication No. 2005/0235869 to Cruchon-Dupeyrat, which is hereby incorporated by reference in its entirety.

Resist applications and formation of semiconductor and silicon structures via etching and self assembled monolayers are described in for example U.S. Patent Publication No. 2006/0014001 to Mirkin et al, which is hereby incorporated by reference in its entirety.

WORKING EXAMPLES

Experimental Section

Materials. Polycrystalline Au films were prepared by evaporating 10 nm of Ti on $SiO_x$ followed by 60 nm of Au at room temperature (see for example Weinberger et al., *Advanced Materials* 2000, 12, 1600-1603; Zhang et al., *Langmuir* 2004, 20, 962-968). 16-Mercaptohexadecanoic acid (MHA) (90%), 1-octadecanethiol (ODT) (98%), fullerene ($C_{60}$) 99.9% and Copper (II) perchlorate hexahydrate (98%) were purchased from Aldrich Chemical Company, Milwaukee, Wis. Acetonitrile (reagent grade) and toluene (99.9%) were purchased from Fisher Scientific. Ethanol (ACS/USP grade) was purchased from Pharmco Products, Inc., Brookfield, Conn. All chemicals were used as received. 1H, 1H, 2H, 2H, perfluorododecylthiol $CF_3(CF_2)_{11}(CH_2)_2SH$ (PFT) was synthesized and purified according to literature procedures (see for example Bain, C. D.; Troughton, E. B.; Tao, Y. T.; Evall, J.; Whitesides, G. M.; Nuzzo, R. G. *J Am Chem Soc* 1989, 111, 321-335; Chidsey, C. E. D.; Loiacono, D. N. *Langmuir* 1990, 6, 682-691). Briefly, $CF_3(CF_2)_{11}(CH_2)_2I$(1-iodo-1H,1H,2H,2H-perfluorododecane, 97%, SynQuest Labs, Alachua, Fla., www.svnquestlabs.com) was converted to the thioacetate derivative using excess potassium thioacetate under refluxing methanol. The product was deprotected to the thiol derivative under a refluxing 3 M NaOH solution in acetone (Zheng, T. C.; Burkart, M.; Richardson, D. E. *Tetrahedron Letters* 1999, 40, 603-606.).

Dip-Pen Nanolithography, Micro Contact Printing and Imaging. DPN experiments were performed with an atomic force microscope (AFM, CP, Veeco/Thermomicroscopes, Sunnyvale, Calif.) equipped with a 100-μm scanner and closed-loop scan control and commercial lithography software (DPNWrite™, DPN System-1, NanoInk, Inc., Chicago, Ill.). Gold coated commercial AFM cantilevers (sharpened $Si_3N_4$, Type A, Nanoink, Inc.) with a spring constant of 0.05 N/m were used for patterning and subsequent imaging. All DPN patterning experiments were carried out under ambient laboratory conditions (about 30% relative humidity, about 20 degrees C.), unless stated otherwise. Controlled atmosphere experiments were conducted inside a $N_2$ atmosphere glove box, where organic solvents could be introduced. Tapping mode images were taken with a Nanoman AFM equipped with a Nanoscope IV controller from Veeco (Santa Barbara, Calif.) with silicon tips (NCH—W, Veeco, spring constant 40 N/m) scanned at a rate of 0.5 Hz and set to a pixel resolution of 512×512. Binary-inking solutions were prepared as a 1:1 mixture of two alkanethiols in ethanol, where the total alkanethiol concentration was 1 mM. Tips were soaked in this solution for a few seconds and subsequently dried under a stream of $N_2$. This was generally repeated three times before the tip was used for patterning. Pure MHA-coated tips were prepared by immersing the cantilevers in an acetonitrile solution saturated with MHA for a few seconds, followed by blowing dry under a stream of nitrogen. Pure ODT-coated tips were prepared by thermal evaporation of neat ODT onto the tips at 65 degrees C. for 30 min.

Micropatterns were generated via μCP. Stamps were fabricated by placing a photolithographically prepared master (Photomask supplied by ADTEK, Quebec, Canada) in a glass Petri dish, followed by pouring a mixture of polydimethylsiloxane (PDMS, Sylgard 184, Dow Corning, Midland, Mich.) in the ratio of 10:1 (v:v) monomer to initiator over the master. After letting the mixture sit for 1 hr to degas, the elastomer was cured overnight at 60 degrees C. and then gently peeled from the master. The stamp was inked with a 1 mM total alkanethiol binary ink solution by gently spreading a drop on the surface of the stamp using a Q-tip. After the stamp was dry, patterned structures were generated on the surface by bringing the stamp (by hand) into contact with a clean Au substrate for 30 s.

Three different alkanethiol inks were examined to investigate the formation of phase-separated structures in the context of DPN and μCP experiments: MHA, ODT and PFT. These compounds were selected to take advantage of different driving forces for phase separation. MHA and ODT are almost identical in molecular weight and structure with the exception of the T-terminal group, where the acid groups of MHA can participate in hydrogen bonding. On the other hand, PFT is a shorter hydrophobic molecule that will have significantly weaker adhesive interactions with MHA.

Figure 7:
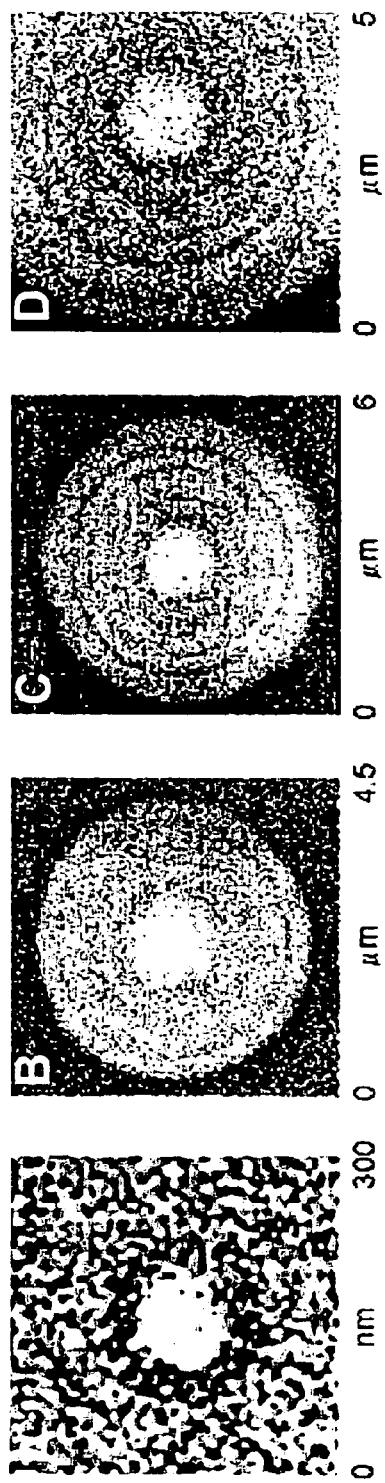
FIG. 7. MHA/ODT phase-separated ring structures formed by repeatedly holding coated tip at the same location. A) LFM image of phase-separated MHA/ODT ink mixture. B) LFM image of 4 tip approaches to the surface, in which 4 concentric rings can be seen. C) LFM image of 5 tip approaches to the surface, in which 5 concentric rings can be seen. This is the same structure in the previous image, but with an additional approach. D) LFM image of 6 tip approaches to the surface, in which 6 concentric rings can be seen. This is the same structure in the previous image, but with an additional approach.

To develop directed nanoscale behavior of these alkanethiol ink mixtures, AFM cantilevers were coated in binary ink mixtures and subsequently used for patterning. An MHA and ODT binary mixture coated AFM tip was held in contact with a gold surface for 8, 4, and 2 seconds three times, and the contact area was subsequently imaged using the same tip by lateral force microscopy (LFM), FIG. 2A. A central white (high contrast, high lateral force) domain can be seen that represents an area predominantly coated with MHA, while an outer dark ring (low contrast, low lateral force) representing mostly ODT is seen at the perimeter of each of the dots (see for example Ivanisevic, A.; McCumber, K. V.; Mirkin, C. A. *J Am Chem Soc* 2002, 124, 11997-12001). When a binary mixture of MHA and PFT were simultaneously deposited, similar structures with slightly higher LFM contrast form, FIG. 2B. Although dots comprise two types of molecules, the diameter of each phase still showed $t^{1/2}$ dependence in accordance with an ink transport model the inventors have previously published and the model put forth by Jang et al. and used thus far to describe the DPN process, FIG. 2C (see for example Rozhok, S.; Piner, R.; Mirkin, C. A. *J Phys Chem B* 2003, 107, 751-757; Jang, J. Y.; Hong, S. H.; Schatz, G. C.; Ratner, M. A. *Journal of Chemical Physics* 2001, 115, 2721-2729; Rozhok, S.; Sun, P.; Piner, R.; Lieberman, M.; Mirkin, C. A. *J Phys Chem B* 2004, 108, 7814-7819; Sheehan, P. E.; Whitman, L. J. *Physical Review Letters* 2002, 88, 156104-156107). Interestingly, when an MHA/ODT tip was brought into contact with the surface repeatedly, ring type structures were formed, FIG. 2D, where each time the tip was held in contact with the surface an additional two rings were formed (one predominantly MHA, and the other was predominantly ODT, see also FIG. 7).

Figure 3:
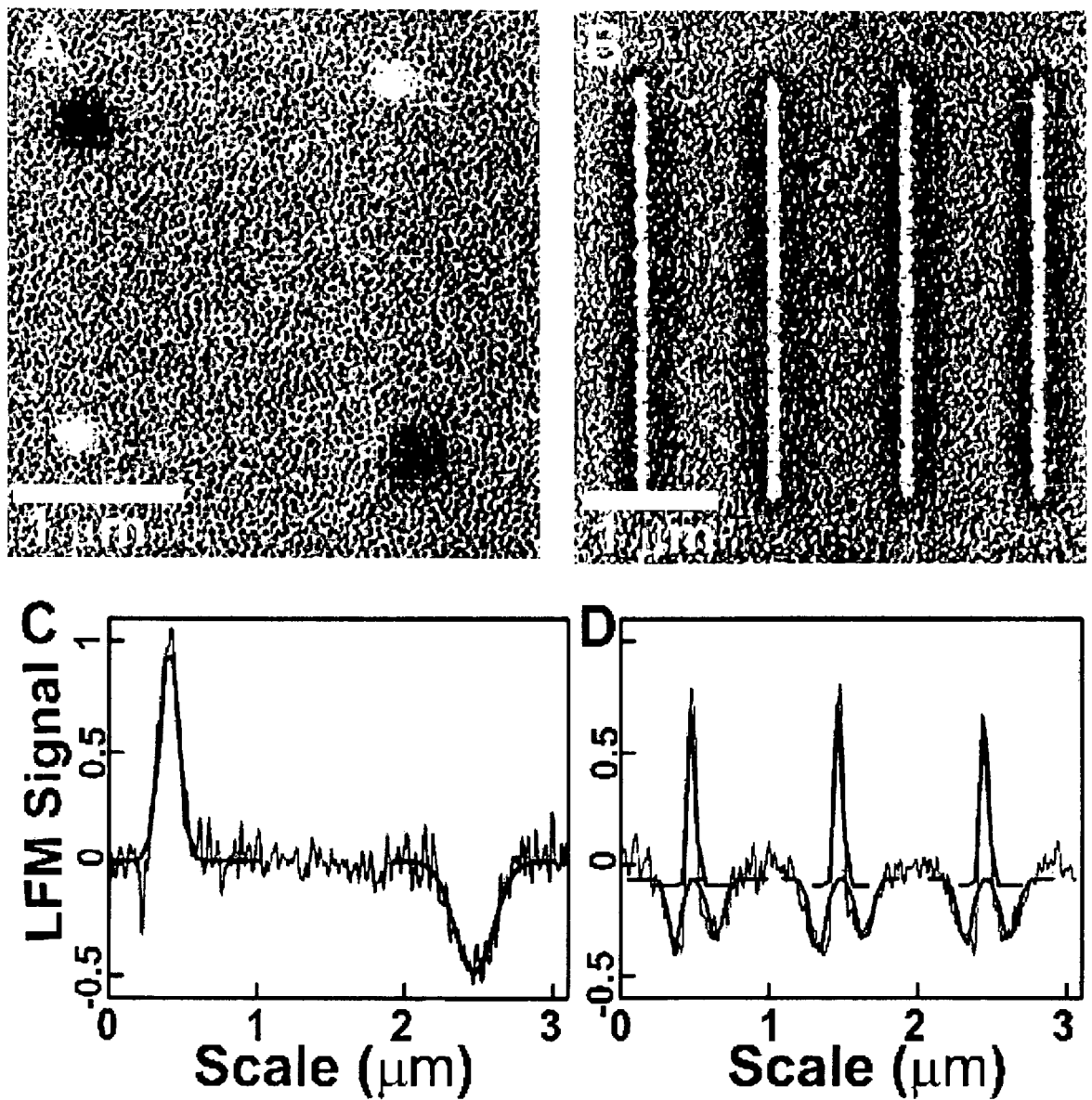
FIG. 3. Comparison of the LFM properties of pure and phase separated DPN deposited alkanethiols on Au. (A) LFM image of pure MHA (white) and pure ODT (black) dots formed by DPN. (B) Four phase separated MHA/PFT lines deposited by moving coated cantilever at a rate of 0.4 microns/s. Corresponding plots show analyses of highlighted regions in each LFM image, where black line represents a Gaussian fit of averaged line scans (red).
Figure 6:
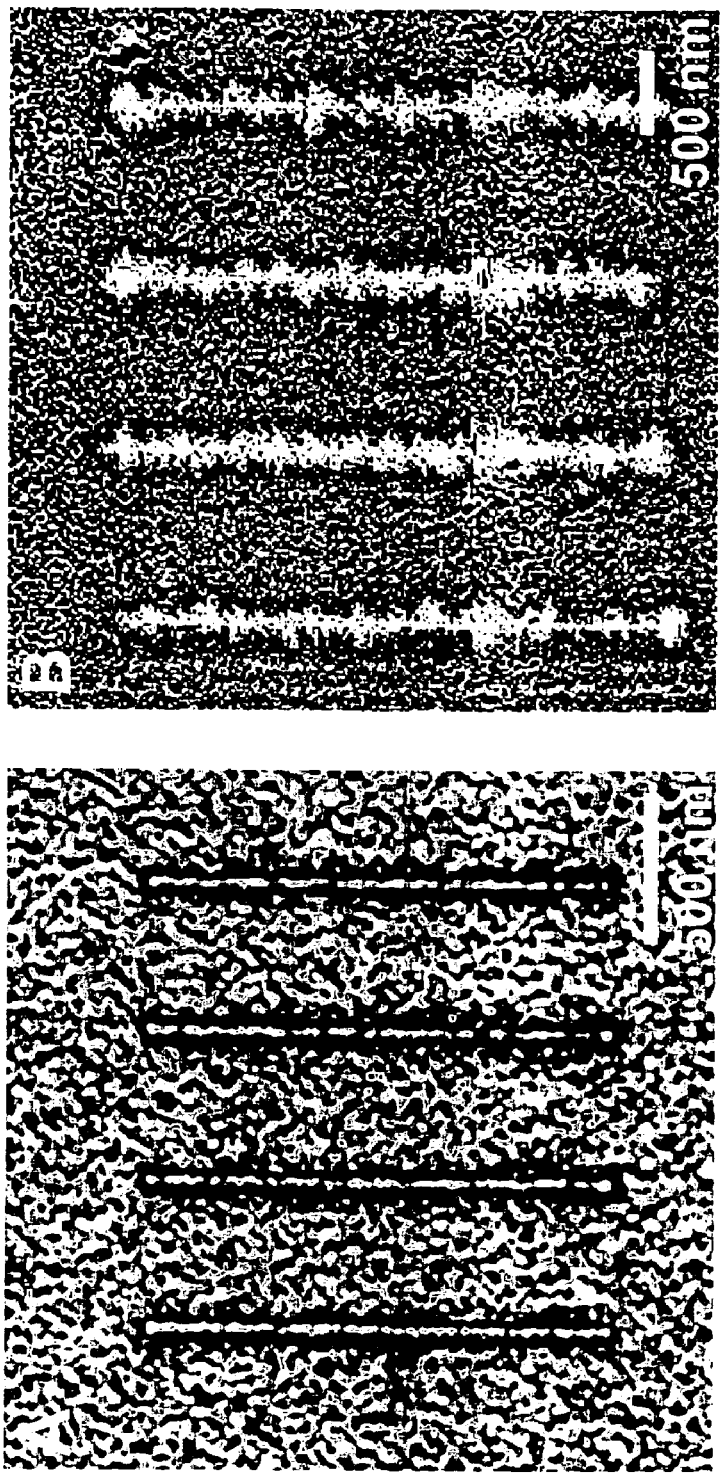
FIG. 6. Effect of meniscus on phase separated binary structure composition. A) LFM image of PFT/MHA lines drawn at 0.8 microns/second in nitrogen atmosphere and B) LFM image of PFT/MHA lines drawn at 0.8 microns per second in methanol atmosphere. All patterns were generated using same coated tip, Au substrate and contact force. AFM was enclosed in nitrogen purged glove box where 1 L of Methanol was introduced into atmosphere.

Phase separation behavior was also independent of the path of the tip, and separated line structures assemble as an MHA/PFT tip was scanned in a line at a rate of 0.2 μm/s, FIG. 3B, where the interior of the structure was composed of primarily MHA and the exterior of mostly PFT. To obtain a better understanding of the degree of phase separation, structures comprised of pure MHA and ODT were patterned, FIG. 3A. The averaged frictional force profiles generated in these experiments showed bands associated with patterns of MHA and ODT, FIG. 3C. The frictional force profiles were modeled as Gaussian distributions, and the peaks of these plots were used to evaluate the distribution of the two components in patterned binary structures. The friction force profile of segregated structures, FIG. 3D, showed less intense peaks (~80%) than those of pure adsorbates, FIG. 3C. This indicated that near-complete segregation was observed in the experiment described in FIG. 3B. The interior of these structures was comprised of the more hydrophilic MHA, and this remained true even when patterning was performed in an inert atmosphere saturated with methanol (see FIG. 6).

Comparison of LFM images collected from pure and mixed-ink nanostructures suggested that mixtures of alkanethiols do indeed phase separate into domains. However, factors such as molecular packing and orientation can have a contribution to the observed frictional force signal (see for example Overney, R. M.; Meyer, E.; Frommer, J.; Guntherodt, H. J.; Fujihira, M.; Takano, H.; Gotoh, Y. *Langmuir* 1994, 10, 1281-1286; Brewer, N. J.; Leggett, G. J. *Langmuir* 2004, 20, 4109-4115). Many surface spectroscopic techniques, such as XPS or grazing angle FT-IR, are capable of discriminating between different alkanethiols, but this is not feasible for sub-100 nm features. In addition, the height of alkanethiols used in these experiments are very similar, and subsequently height mode images are not useful for discriminating between the two different molecules, especially on polycrystalline Au films with an RMS roughness of 1 nm. One can therefore take advantage of the ability of the terminal acid groups of MHA to coordinate to metals such as $Cu^{+2}$ and build metal-organic multilayers as demonstrated by Evans et al. (see for example Evans, S. D.; Ulman, A.; Goppertberarducci, K. E.; Gerenser, L. J. *J Am Chem Soc* 1991, 113, 5866-5868) to provide additional evidence as to the chemical identity of the mixed-ink nanostructures.

Figure 2:
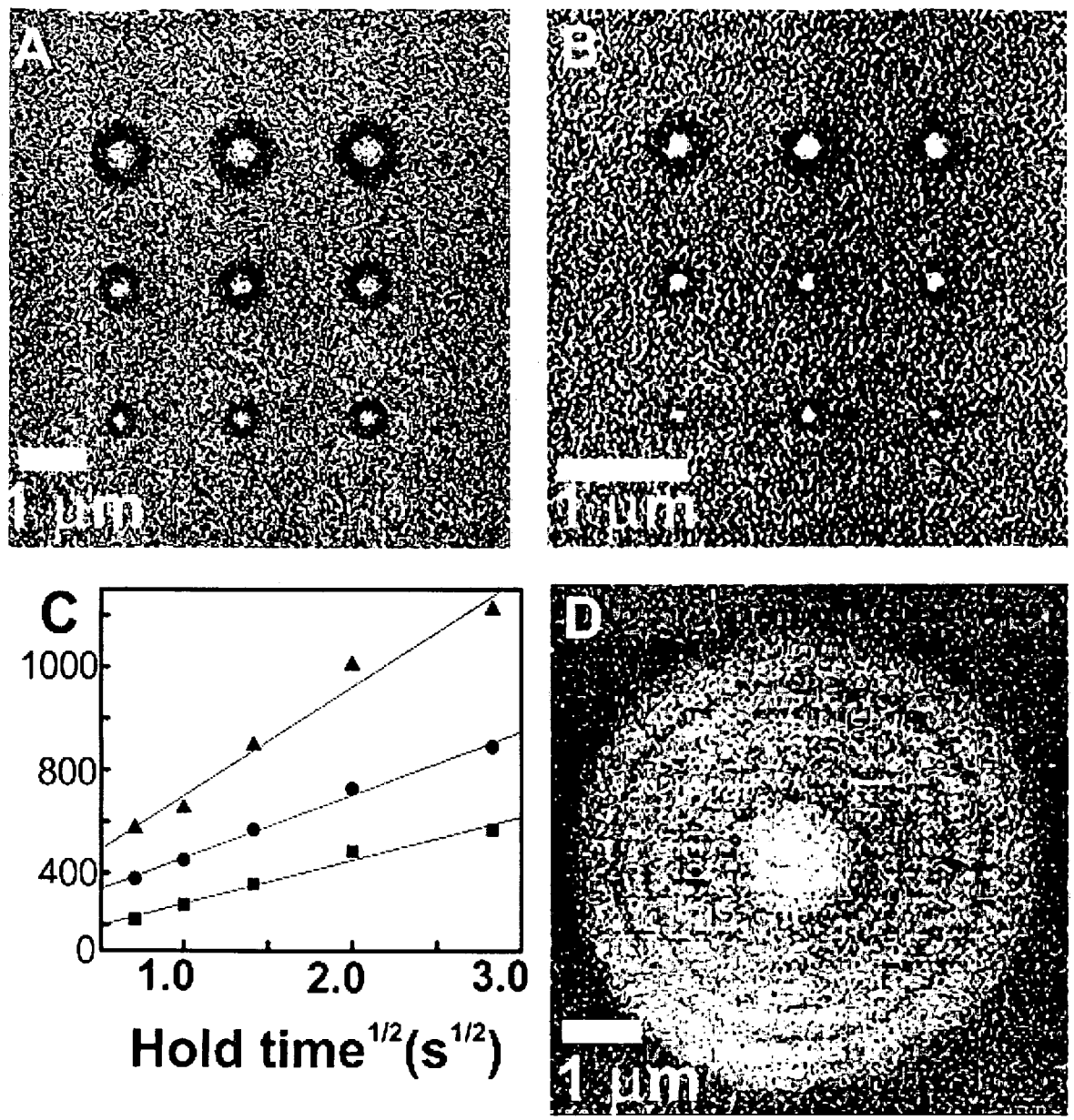
FIG. 2. LFM images of phase separated structures patterned on Au surface with binary ink coated tip. (A) MHA interior and ODT exterior dots and (B) MHA interior and PFT exterior dots formed by holding tip 8, 4, and 2 seconds. (C) Plot of phase diameter vs holding time showing $t^{1/2}$ dependence for MHA/ODT dots (triangles, circles, and square represent entire dot, ODT phase, and MHA phase, respectively). (D) MHA/ODT ring structure made by repeatedly approaching surface (5 times).
Figure 4:
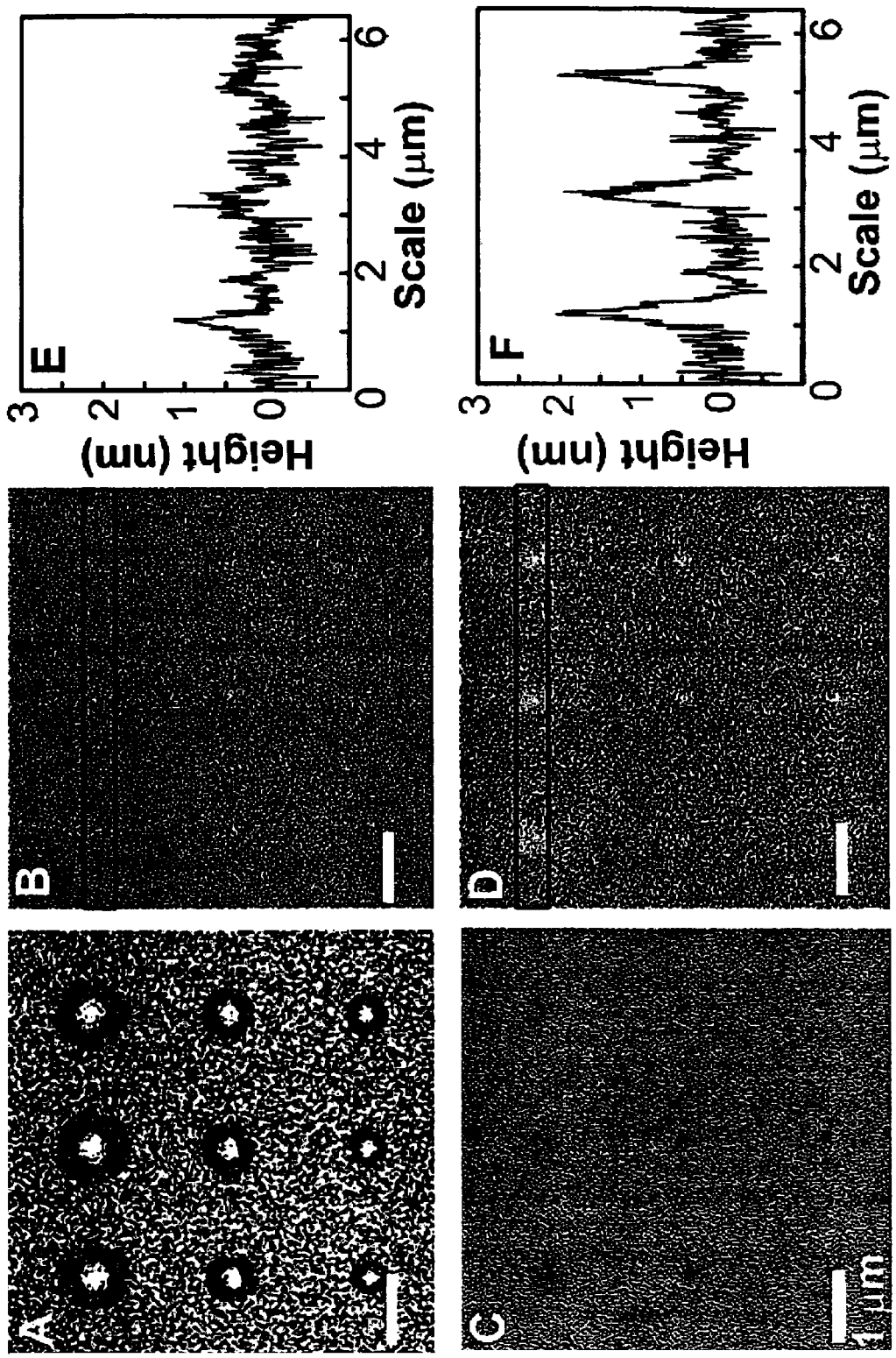
FIG. 4. Probing the chemical composition of segregated binary ink patterns by utilizing selective metal-organic coordination to the terminal carboxy group of MHA. A) LFM image of 3×3 MHA/ODT phase separated dot array. B) Tapping mode height and C) corresponding phase image of an ODT passivated dot array. Note that dots are of similar height to the background. D) Tapping mode height image of dot array after coordinating a layer of MHA onto a $Cu^{+2}$ incubated substrate. Averaged line scans of mixed-ink dots (E) before and (F) after growth of the MHA layer, which show a height increase of 1.6 nm±0.1 nm only in the interior region of each dot.

As described in FIG. 2A, an MHA/ODT mixed ink-coated tip was used to pattern an array (3×3) of dots, and the resulting LFM image is shown in FIG. 4A. The sample was then exposed to a 1 mM ODT solution in ethanol for 10 minutes, which renders unpatterned bare Au areas unreactive toward coordination to $Cu^{+2}$. Excess material is washed under a stream of ethanol and water, and the substrate is subsequently imaged in tapping mode. Patterned dots are undetectable in height mode, FIG. 4B, since the heights of MHA and ODT are very similar. However, the interior of these dots are detectable in phase mode, FIG. 4C, which indicates that the interior of these dots are different than the ODT passivated exterior regions. A metal-organic coordinating layer is then selectively adsorbed onto the MHA areas by incubating the sample in a 1 mM $CuClO_4$ solution in ethanol for 15 min followed by rinsing and further immersing the Au film in a 1 mM MHA solution for 15 min. After removing physisorbed material with ethanol rinses, the sample is again imaged by using tapping mode to minimize sample damage. Height mode images, FIG. 4D, show that only the interior regions of each of the dots have increased in height. Averaged line scan analyses of dots before, FIG. 4E, and after, FIG. 4F, coordination layer growth show that the interior region of each dot has increased in height by 1.6 nm±0.1 nm. This value agrees with previously published results for the thickness of an MHA layer grown onto a monolayer of $Cu^+$ (see for example Evans, S. D.; Ulman, A.; Goppertberarducci, K. E.; Gerenser, L. J. *J Am Chem Soc* 1991, 113, 5866-5868; Hatzor, A.; Weiss, P. S. *Science* 2001, 291, 1019-1020. The chemical reactivity data agrees with the frictional force data, thus showing that the more hydrophilic MHA will generate a central phase, while the more hydrophobic ODT will form an outer perimeter phase when the two alkanethiols are deposited simultaneously by DPN. The observed phase separation in the patterned nanostructures is presumably the result of enthalpic contributions, since entropy would favor mixing of the constituents within the generated patterns. Spontaneous phase separation driven by hydrogen bonding or van der Waals interactions is consistent with previous reports in bulk SAMs. Leggett et al. have determined that the contribution from hydrogen bonding within an acid terminated monolayer to be equivalent to the van der Waals stabilization of nine methylene groups (see for example Cooper, E.; Leggett, G. J. *Langmuir* 1999, 15, 1024-1032.). MHA is only two methylene groups shorter than ODT, and therefore hydrogen bonding interactions would be expected to provide a major driving force for phase separation of a mixture of MHA and ODT. In the case of MHA/PFT mixtures, the driving force for phase separation is a combination of both hydrogen bonding as well as van der Waals interactions, since there are only two methylene units in PFT. This may explain why LFM contrast in the MHA/ODT system is lower than that of MHA/PFT. The separation may also be enhanced by the water/air interface at the surface of the water meniscus formed during patterning (Rozhok, S.; Piner, R.; Mirkin, C. A. *J Phys Chem B* 2003, 107, 751-757; Rozhok, S.; Sun, P.; Piner, R.; Lieberman, M.; Mirkin, C. A. *J Phys Chem B* 2004, 108, 7814-7819; Jang, J. Y.; Schatz, G. C.; Ratner, M. A. *Physical Review Letters* 2004, 92.). Furthermore, the kinetics of ink transport from tip to surface are certainly a factor in determining the ultimate nanopattern composition, especially with regard to adsorbate solubility and diffusion in water. For example, the solubility of MHA is at least 3 orders of magnitude larger than that of ODT. As a result, MHA molecules will certainly reach the Au surface at a more rapid rate than that of ODT (Solubility of ODT in water is $2.37 \times 10^{-4}$ mg/L at 25° C., while 8-hexadecanoic acid, $C_{16}H_{30}O_2$, which is closely related to MHA in chemical structure has a solubility of $1.33 \times 10^{-1}$ mg/L. (from Meylan W. M.; Howard P. H. Environ. Toxicol. Chem. 1996, 15, 100)). The difference of ink solubility in the meniscus explains why the predominantly MHA phase is always observed at the center of these binary structures. It also explains why introducing a methanol atmosphere influences the rate of transport and the magnitude of phase separation (see FIG. 6).

Figure 5:
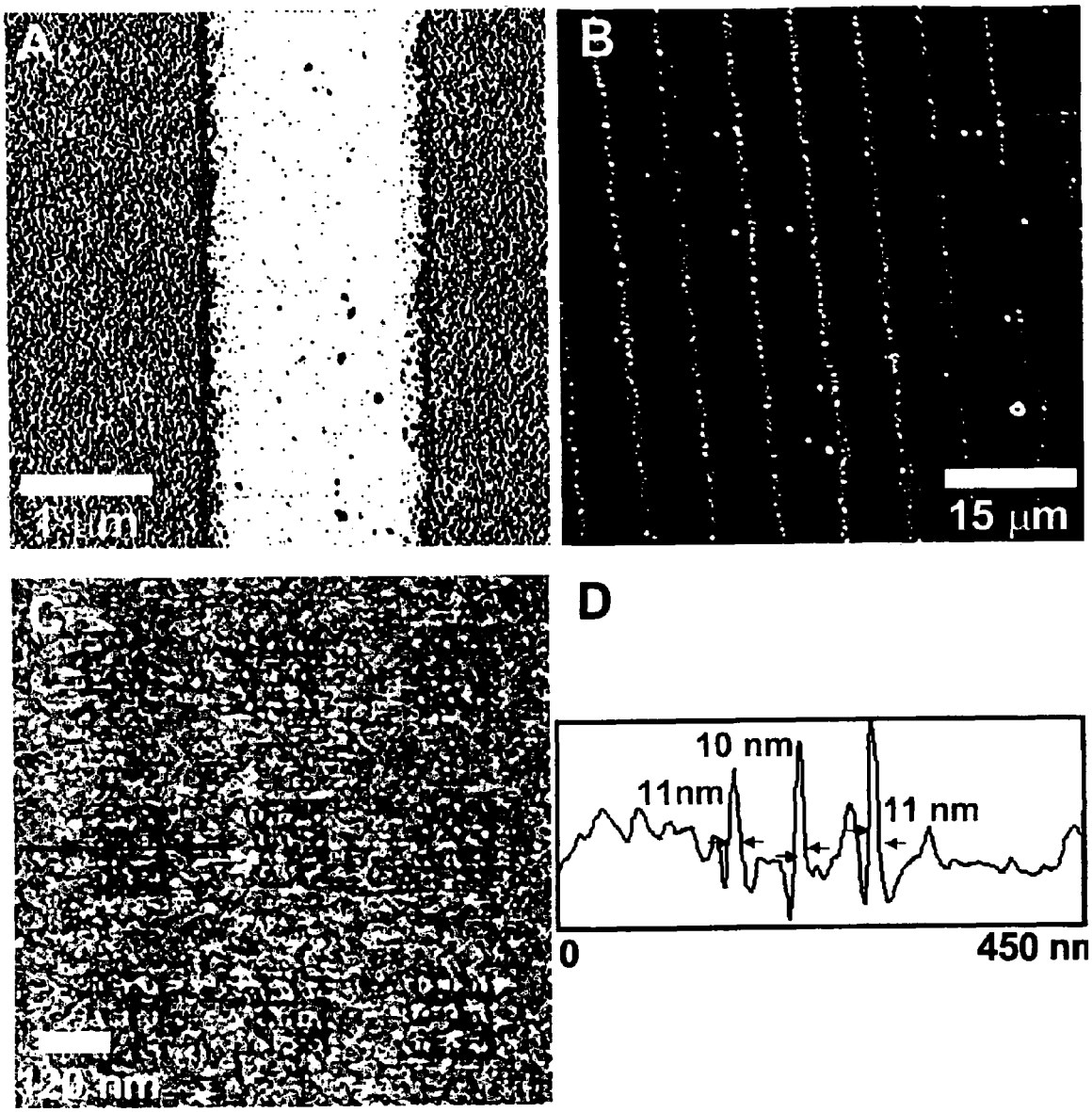
FIG. 5. Exploiting phase separation of MHA/PFT to improve the resolution of DPN and μCP. (A) LFM image of 2 μm stamp applied onto a gold substrate. (B) Dark field micrograph of templated $C_{60}$ aggregates onto (A) after passivation with MHA and incubation in 0.2 mg/ml $C_{60}$ solution in toluene. (C) DPN of binary mixed ink dots on Au(111) surface and (D) is line scan profile through highlighted region.
Figure 8:
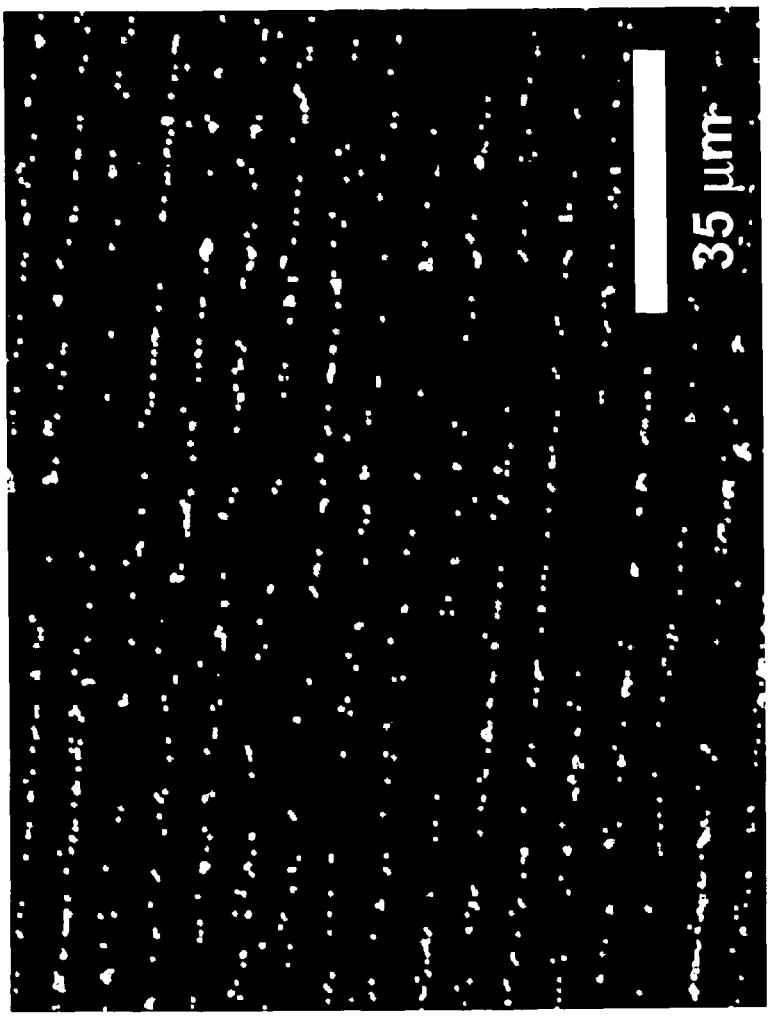
FIG. 8. Dark field micrograph of 1:1MHA:PFT stamped Au substrate, passivated in 1 mM MHA then exposed to 320 nm COOH functionalized polystyrene spheres (Bang Labs). Particles repelled by MHA, but adsorb onto PFT patterned area.

This phenomenon can, in principle, provide two advantages to a variety of chemical-based lithographies, such as μCP and DPN. First, it can potentially increase the ultimate resolution of a variety of these techniques, and second, it can simultaneously generate multi-component structures. To demonstrate this, a binary mixture of 1:1 MHA:PFT ink (1 mM total concentration) was coated onto a poly(dimethylsiloxane) (PDMS) stamp, and the stamp was immediately applied onto a gold surface. The resulting patterns show phase separated lines of alkanethiol, FIG. 5A. The central region of the patterned lines is comprised of predominantly MHA, while the perimeter of these lines is made of predominantly PFT. Interestingly, the width of the PFT lines is 100 nm, which is 20 times smaller than the width of the stamp features (2 µm). These features are also 5 times smaller than what can typically be obtained using conventional µCP (Odom, T. W.; Love, J. C.; Wolfe, D. B.; Paul, K. E.; Whitesides, G. M. *Langmuir* 2002, 18, 5314-5320). Furthermore, only a few techniques are capable of patterning multi-component structures at sub-micrometer resolution (Hong, S. H.; Zhu, J.; Mirkin, C. A. *Science* 1999, 286, 523-525.; Gerding, J. D.; Willard, D. M.; Van Orden, A. *J Am Chem Soc* 2005, 127, 1106-1107.), and each suffers from drawbacks. Multi-component patterning has been demonstrated using conventional µCP (Tien, J.; Nelson, C. M.; Chen, C. S. *Proceedings of the National Academy of Sciences of the United States of America* 2002, 99, 1758-1762; Inerowicz, H. D.; Howell, S.; Regnier, F. E.; Reifenberger, R. *Langmuir* 2002, 18, 5263-5268.). However, multi-component patterning has only been achieved at the micrometer length scale. Utilizing phase separation is advantageous because the pattern resolution and component registry are defined by the choice of ink pairs and by the stamp feature size. In addition, monolayer structures generated using the phase separation of binary ink mixtures can be further used to direct the assembly of a wide variety of materials. For example, when a 1:1 MHA:PFT stamped gold film, FIG. 5A, is rendered hydrophilic by incubating in an MHA solution (2 min), and is subsequently exposed to a toluene solution of $C_{60}$ (0.2 mg/ml), aggregates will selectively assemble onto the hydrophobic PFT lines, FIG. 5B. $C_{60}$ aggregates assemble more readily onto the PFT regions because of hydrophobic interactions. This also provides additional evidence for the chemical identity of the phase separated regions. In addition to $C_{60}$, we have also used this procedure to selectively deposit polystyrene spheres (see FIG. 8).

If a binary ink mixture is deposited onto a Au(111) substrate using DPN, sub-15 nm MHA structures form in the interior of dots that have diameters as large as 50 nm, FIG. 5C and D.

Figure 9:
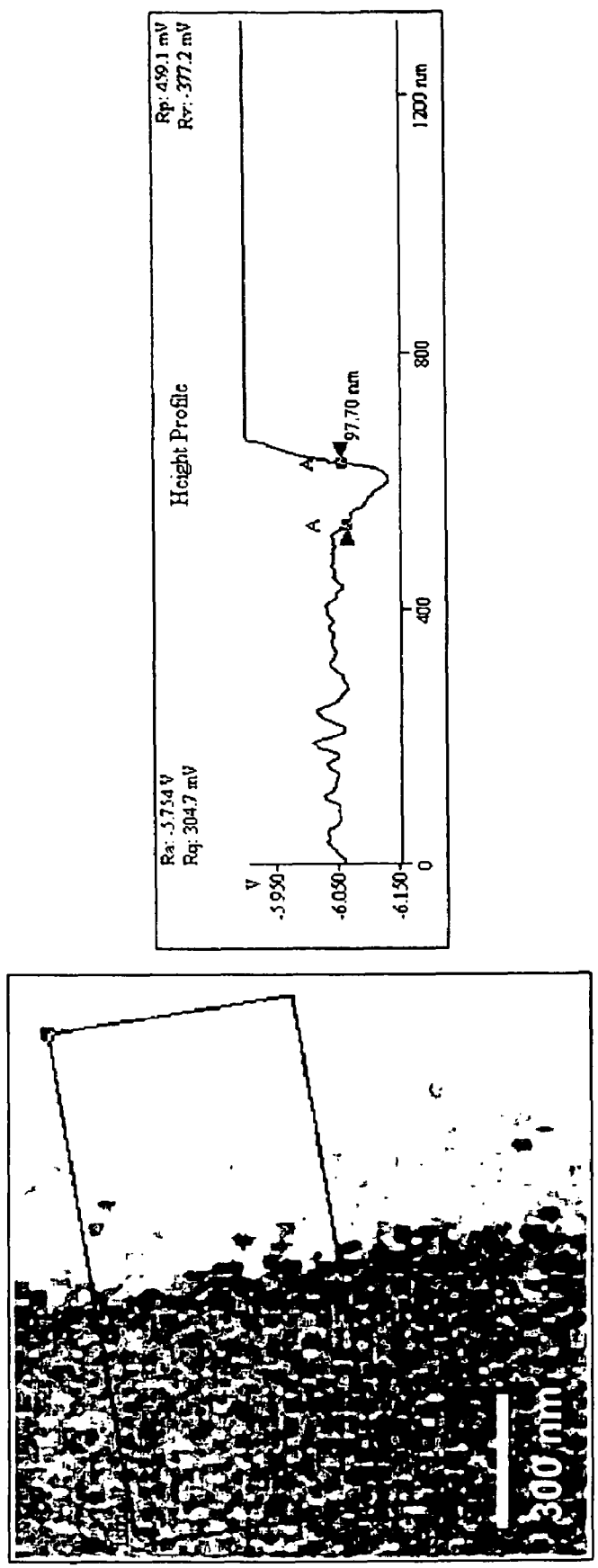
FIG. 9. LFM image and corresponding averaged area profile of a gold substrate stamped with a 1:1MHA:PFT mixture.
Figure 10:
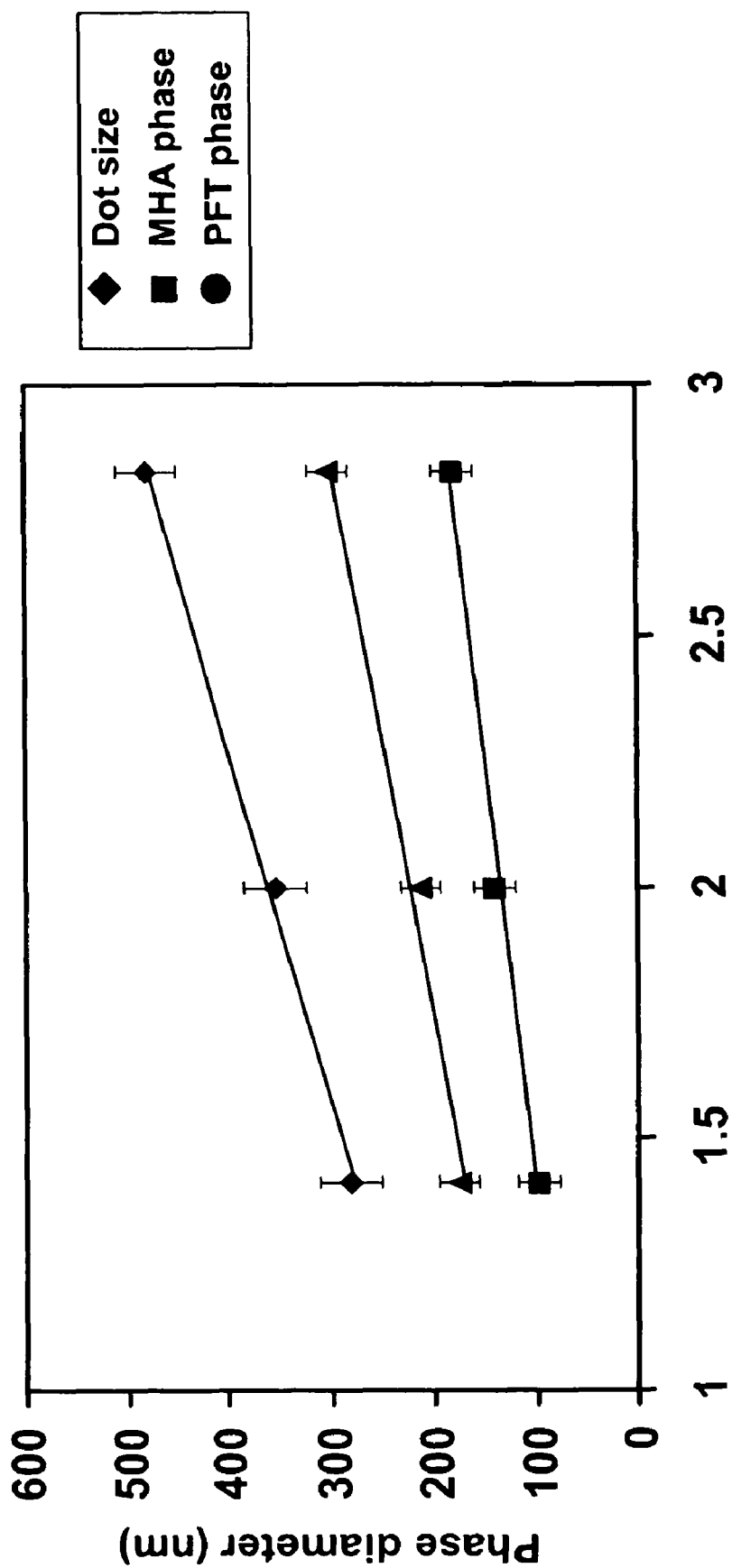
FIG. 10. Plot of phase diameter vs. hold time$^{1/2}$ for MHA/PFT structures. Each data point is averaged from three different phase separated dots held at 8, 4, and 2 second hold times.

FIGS. 9 and 10 provide additional examples. In FIG. 9, a stamp was used in microcontact printing showing it can produce after stamping a feature about 100 nm wide when using ink comprising two patterning compounds. In general, these kinds of stamped features can be for example about 50 nm to about 500 nm, or about 75 nm to about 250 nm. Line widths under 100 nm can be achieved with microcontact printing. Hence, this illustrates the improved resolution over microcontact printing with single inks. FIG. 10 shows additional evidence for a tip embodiment similar to that of FIG. 2C. Diffusion growth, or at least quasi-diffusion growth, is demonstrated.

What is claimed is:

1. A method comprising:
   disposing an ink mixture comprising a first patterning compound and a second patterning compound on a nanoscopic tip, wherein the first patterning compound and the second patterning compound are adapted to phase separate from each other on a surface,
   contacting the nanoscopic tip with the surface,
   wherein transport of the first and second patterning compounds occurs together from the nanoscopic tip to the surface to produce on the surface a phase separated structure comprising the first and second patterning compounds.

2. The method according to claim 1, wherein the tip is a scanning probe microscope tip.

3. The method according to claim 1, wherein the tip is an atomic force microscope tip.

4. The method according to claim 1, wherein the tip is a solid tip.

5. The method according to claim 1, wherein the tip is a hollow tip.

6. The method according to claim 1, wherein the tip comprises a channel for delivery of the ink mixture.

7. The method according to claim 1, wherein disposing the ink mixture on the tip comprises immersing the tip in an ink mixture.

8. The method according to claim 1, wherein disposing the ink mixture on the tip comprises immersing the tip in an ink mixture and then drying the ink mixture.

9. The method according to claim 1, wherein disposing the ink mixture on the tip comprises immersing the tip in an ink mixture and then fully drying the ink mixture.

10. The method according to claim 1, wherein disposing the ink mixture on the tip comprises moving the ink to the end of the tip.

11. The method according to claim 1, wherein the ink mixture comprises a solvent for the first and second patterning compounds.

12. The method according to claim 1, wherein the ink mixture comprises the first and second patterning compounds substantially free of solvent.

13. The method according to claim 1, wherein the first and second patterning compounds are adapted to covalently bond to or chemisorb to the surface.

14. The method according to claim 1, wherein the first and second patterning compounds are adapted to form self assembled monolayers.

15. The method of claim 1, wherein the first patterning compound is adapted to provide a hydrophobic surface and the second patterning compound is adapted to provide a hydrophilic surface.

16. The method according to claim 1, wherein the first patterning compound and the second patterning compound each are molecular compounds having molecular weight of about 1,000 grams per mole or less.

17. The method according to claim 1, wherein the first patterning compound and the second patterning compound each can be represented by X—Y-T, wherein X is a functional group adapted for binding to the surface, Y is a spacer moiety, and T is a terminal group.

18. The method according to claim 1, wherein the first patterning compound comprises alkyl terminated groups or fluoro-terminated groups.

19. The method according to claim 1, wherein the second patterning compound provides acid-terminated groups.

20. The method according to claim 1, wherein the second patterning compound comprises a terminal group which is capable of hydrogen bonding, and the first patterning compound comprises a terminal group which is not capable of hydrogen bonding.

21. The method according to claim 1, wherein the contacting step is carried out under a contact mode.

22. The method according to claim 1, wherein the contacting step is carried out under a non-contact mode.

23. The method according to claim 1, wherein the contacting step is carried out under an intermittent contact mode.

24. The method according to claim 1, wherein the contacting step is carried out without translation of the tip over the surface.

25. The method according to claim 1, wherein the contacting step is carried out with translation of the tip over the surface.

26. The method according to claim 1, wherein the phase separated structure comprises the first patterning compound surrounding the second patterning compound.

27. The method according to claim 1, wherein the phase separated structure is in the form of a dot with the first patterning compound concentrated at the exterior and the second patterning compound concentrated at the interior.

28. The method according to claim 1, wherein the phase separated structure is in the form of a dot comprising an interior circle surrounded by a ring.

29. The method according to claim 1, wherein the phase separated structure is in the form of a dot comprising an interior circle surrounded by a plurality of rings.

30. The method according to claim 1, wherein the transport is adapted so that the phase separated structure has a diameter which grows by diffusion as a function of hold time.

31. The method according to claim 1, wherein the phase separated structure comprises a line.

32. The method according to claim 1, wherein the phase separated structure comprises a linear line or a curvilinear line.

33. The method according to claim 1, further comprising modifying the surface surrounding the phase separated structure.

34. The method according to claim 1, further comprising the step of modifying the phase separated structure.

35. The method according to claim 1, further comprising modifying the phase separated structure, wherein the modification selectively modifies only one of the first and second patterning compounds.

36. The method according to claim 1, wherein the phase separated structure is substantially flat.

37. The method according to claim 1, wherein the transport is carried out under humidity and conditions favoring a water meniscus between the tip and the surface.

38. The method according to claim 1, wherein the transport is carried out under conditions not favoring a water meniscus between the tip and surface.

39. The method according to claim 1, wherein the method is repeated to provide layered phase separated structures.

40. The method according to claim 1, wherein the tip disposed on a cantilever is part of a larger structure comprising a plurality of tips disposed on a plurality of cantilevers.

41. The method according to claim 1, wherein the tip disposed on a cantilever is part of a larger structure comprising a plurality of tips disposed on a plurality of cantilevers, and the plurality of cantilevers are adapted for individual actuation.

42. The method according to claim 1, wherein the ink mixture comprises only two patterning compounds.

43. The method according to claim 1, wherein the ink mixture consists essentially of two patterning compounds and a solvent system.

44. The method according to claim 1, wherein the ink mixture comprises a third patterning compound.

45. The method according to claim 1, wherein the phase separated structure is characterized by a lateral dimension which is about two microns or less.

46. The method according to claim 1, wherein the phase separated structure is characterized by a lateral dimension which is about one micron or less.

47. The method according to claim 1, wherein the phase separated structure is characterized by a lateral dimension which is about 500 nm or less.

48. The method according to claim 1, wherein the phase separated structure is characterized by a lateral dimension which is about 100 nm or less.

49. The method according to claim 1, wherein the phase separated structure is a dot characterized by a dot diameter which is about 10 nm to about 2 microns.

50. The method according to claim 1, wherein the phase separated structure is a line having a line width of about one micron or less.

51. The method according to claim 1, wherein the surface comprises a solid surface.

52. The method according to claim 1, wherein the surface is an inorganic surface.

53. The method according to claim 1, wherein the surface is an organic surface.

54. The method according to claim 1, wherein the surface comprises a metal or metal oxide surface.

55. The method according to claim 1, wherein the phase separated structure is in the form of a dot comprising an interior circle surrounded by a ring, wherein the ring comprises first patterning compound and the interior circle comprises second patterning compound.

56. The method according to claim 1, wherein the ink is disposed on a solid tip, wherein the contacting step is carried out without translation of the tip over the surface, and wherein the phase separated structure comprises the first patterning compound surrounding the second patterning compound.

57. The method according to claim 1, wherein the ink is disposed on a solid atomic force microscope tip, wherein the contacting step is carried out without translation of the tip over the surface, and wherein the phase separated structure comprises the first patterning compound surrounding the second patterning compound, wherein the first patterning compound is adapted to provide a hydrophobic and the second patterning compound is adapted to provide a hydrophilic surface.

58. A method for producing a bioarray comprising:
forming a phase separated structure according to claim 1,
adding a biological molecule to the phase separated structure.

59. A method according to claim 58, wherein the biological molecule comprises a protein or peptide or nucleic acid.

60. A method comprising:
disposing an ink mixture comprising a first patterning compound and a second patterning compound on a nanoscopic tip, wherein the first patterning compound and the second patterning compound are adapted to phase separate from each other on a surface,
contacting the nanoscopic tip with the surface,
wherein transport of the first and second patterning compounds occurs together from the nanoscopic tip to the surface to produce on the surface a first feature comprising the first and second patterning compounds, wherein the first patterning compound comprises a hydrophobic tail, and the second patterning compound comprises a hydrophilic tail, and
wherein within the first feature the first and second patterning compounds phase separate from each other to produce a sub-feature, wherein the sub-feature comprises the second patterning compound but is substantially free of the first patterning compound, and wherein the sub-feature has a feature size less than the first feature.

61. The method according to claim 60, wherein the tip is a solid tip.

62. The method according to claim 60, wherein the tip comprises a scanning probe microscope tip.

63. The method according to claim 60, wherein the tip comprises an atomic force microscope tip.

64. The method according to claim 60, wherein the first and second patterning compounds are adapted to chemisorb to the surface.

65. The method according to claim 60, wherein the delivery step is carried out without translation of the tip over the surface.

66. The method according to claim 60, wherein the delivery step is carried out with translation of the tip over the surface.

* * * * *